US009893251B2

(12) United States Patent
Kim et al.

(10) Patent No.: US 9,893,251 B2
(45) Date of Patent: Feb. 13, 2018

(54) LIGHT-EMITTING DEVICE PACKAGES AND METHODS OF MANUFACTURING THE SAME

(71) Applicant: Samsung Electronics Co., Ltd., Suwon-si, Gyeonggi-do (KR)

(72) Inventors: Jung-sub Kim, Suwon-si (KR); Yong-il Kim, Seoul (KR); Dong-gun Lee, Hwaseong-si (KR); Kyung-wook Hwang, Hwaseong-si (KR); Jin-sub Lee, Suwon-si (KR); Min-gyeong Gwon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/362,966

(22) Filed: Nov. 29, 2016

(65) Prior Publication Data
US 2017/0244010 A1 Aug. 24, 2017

(30) Foreign Application Priority Data

Feb. 24, 2016 (KR) .................. 10-2016-0022012

(51) Int. Cl.
*H01L 33/58* (2010.01)
*H01L 33/56* (2010.01)
(Continued)

(52) U.S. Cl.
CPC ............. *H01L 33/58* (2013.01); *G02B 5/208* (2013.01); *H01L 33/0079* (2013.01);
(Continued)

(58) Field of Classification Search
CPC .. H01L 33/58; H01L 33/60; H01L 2933/0058
(Continued)

(56) References Cited

U.S. PATENT DOCUMENTS 4,204,222 A  5/1980  Zacharie
6,025,894 A  2/2000  Shirasaki et al.
(Continued)

FOREIGN PATENT DOCUMENTS

JP  10-189237  * 7/1998  ............. H05B 33/02
JP  10189237 A  7/1998
(Continued)

OTHER PUBLICATIONS

Abstract, Sukagata, Japanese Patent Publication No. JP 2010-189237, JPO & INPIT, all pages.*

*Primary Examiner* — Victoria K Hall
(74) *Attorney, Agent, or Firm* — Harness, Dickey & Pierce

(57) ABSTRACT

A light-emitting device package includes a plurality of luminescent structures arranged spaced apart from each other in a horizontal direction, an intermediate layer on the plurality of luminescent structures, and wavelength conversion layers on the intermediate layer, the wavelength conversion layers vertically overlapping separate, respective luminescent structures of the plurality of luminescent structures. The intermediate layer may include a plurality of layers, the plurality of layers associated with different refractive indexes, respectively. The intermediate layer may include a plurality of sets of holes, each set of holes may include a separate plurality of holes, and each wavelength conversion layer may vertically overlap a separate set of holes on the intermediate layer.

20 Claims, 32 Drawing Sheets

(51) Int. Cl.
*H01L 33/50* (2010.01)
*H01L 33/06* (2010.01)
*H01L 33/32* (2010.01)
*H01L 33/60* (2010.01)
*H01L 33/00* (2010.01)
*G02B 5/20* (2006.01)

(52) U.S. Cl.
CPC .............. *H01L 33/06* (2013.01); *H01L 33/32* (2013.01); *H01L 33/504* (2013.01); *H01L 33/56* (2013.01); *H01L 33/60* (2013.01); *H01L 2933/005* (2013.01); *H01L 2933/0041* (2013.01); *H01L 2933/0058* (2013.01)

(58) Field of Classification Search
USPC .......................................................... 257/98
See application file for complete search history.

(56) References Cited

U.S. PATENT DOCUMENTS

| | | | |
|---|---|---|---|
| 6,155,699 A * | 12/2000 | Miller | H01L 33/46 257/95 |
| 6,372,608 B1 | 4/2002 | Shimoda et al. | |
| 6,645,830 B2 | 11/2003 | Shimoda et al. | |
| 6,650,045 B1 | 11/2003 | Forrest et al. | |
| RE38,466 E | 3/2004 | Inoue et al. | |
| 6,727,646 B1 | 4/2004 | Koyama et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,405,103 B2 * | 3/2013 | Lee | H01L 33/42 257/13 |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,772,761 B2 | 7/2014 | Yamae et al. | |
| 9,548,426 B2 * | 1/2017 | Kim | H01L 33/46 |
| 9,761,756 B2 * | 9/2017 | Kalliakos | H01L 33/06 |
| 2008/0042153 A1 * | 2/2008 | Beeson | H05B 33/10 257/94 |
| 2009/0064717 A1 * | 3/2009 | Son | C03C 8/04 65/42 |
| 2010/0117997 A1 * | 5/2010 | Haase | H01L 27/156 345/204 |
| 2011/0260187 A1 * | 10/2011 | Kim | H01L 33/46 257/98 |
| 2014/0070244 A1 | 3/2014 | Kim et al. | |
| 2015/0049486 A1 | 2/2015 | Jung et al. | |
| 2016/0005922 A1 * | 1/2016 | Huang | H01L 33/46 257/98 |
| 2017/0062680 A1 * | 3/2017 | Yoo | H01L 33/60 |
| 2017/0133559 A1 * | 5/2017 | Basin | H01L 33/505 |
| 2017/0141162 A1 * | 5/2017 | Kim | H01L 27/322 |
| 2017/0250316 A1 * | 8/2017 | Yeon | H01L 33/486 |
| 2017/0250318 A1 * | 8/2017 | Cha | H01L 33/502 |

FOREIGN PATENT DOCUMENTS

| | | | | |
|---|---|---|---|---|
| JP | 2009104844 A | | 5/2009 | |
| JP | 2010-189237 | * | 9/2010 | ............ C04B 33/32 |
| KR | 20050022820 A | | 3/2005 | |
| KR | 100507393 B1 | | 8/2005 | |
| KR | 20130104628 A | | 9/2013 | |
| KR | 101532700 B1 | | 7/2015 | |
| KR | 20150129890 A | | 11/2015 | |

\* cited by examiner

LIGHT-EMITTING DEVICE PACKAGES AND METHODS OF MANUFACTURING THE SAME

CROSS-REFERENCE TO RELATED APPLICATION

This application claims the benefit of Korean Patent Application No. 10-2016-0022012, filed on Feb. 24, 2016, in the Korean Intellectual Property Office, the disclosure of which is incorporated herein in its entirety by reference.

BACKGROUND

The inventive concepts relate to light-emitting devices package and methods of manufacturing the same, and more particularly, to light-emitting device packages configured to emit light having one or more various colors and methods of manufacturing the same.

A semiconductor light-emitting device, which has a long lifetime, low power consumption, and a fast response speed, and is environmentally friendly, is used as a light source in a variety of products such as a lighting device or a backlight of a display device. In some example embodiments, a light-emitting device package capable of improving luminous efficiency of a semiconductor light-emitting device and reducing costs of manufacturing is required.

SUMMARY

The inventive concepts provide light-emitting device packages configured to enable improved luminous efficiency and reduced costs of manufacturing the same, and methods of manufacturing the same.

According to some example embodiments of the inventive concepts, a light-emitting device package may include a plurality of luminescent structures, an intermediate layer on the plurality of luminescent structures, the intermediate layer including a plurality of layers, a plurality of wavelength conversion layers on the intermediate layer, and a sealing member configured to cover the intermediate layer and the wavelength conversion layers. The plurality of luminescent structures may be spaced apart from each other in a horizontal direction. The plurality of layers may be associated with different refractive indexes, respectively. The wavelength conversion layers may vertically overlap separate, respective luminescent structures of the plurality of luminescent structures. The sealing member may be further configured to at least partially fill at least one space between at least two adjacent wavelength conversion layers.

According to some example embodiments of the inventive concepts, a light-emitting device package may include a plurality of luminescent structures, an intermediate layer on the plurality of luminescent structures, and a plurality of wavelength conversion layers on the intermediate layer. The wavelength conversion layers may vertically overlap separate, respective luminescent structures of the plurality of luminescent structures. The intermediate layer may include a plurality of holes. The plurality of luminescent structures may be spaced apart from each other in a horizontal direction.

According to some example embodiments of the inventive concepts, a light-emitting device package may include a plurality of luminescent structures, an intermediate layer on the plurality of luminescent structures, and a plurality of wavelength conversion layers on the intermediate layer. The wavelength conversion layers may vertically overlap sepa-
rate, respective luminescent structures of the plurality of luminescent structures. Each wavelength conversion layer may be configured to filter light emitted by a respective overlapped luminescent structure to emit light in a separate wavelength band. The plurality of luminescent structures may be spaced apart from each other.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
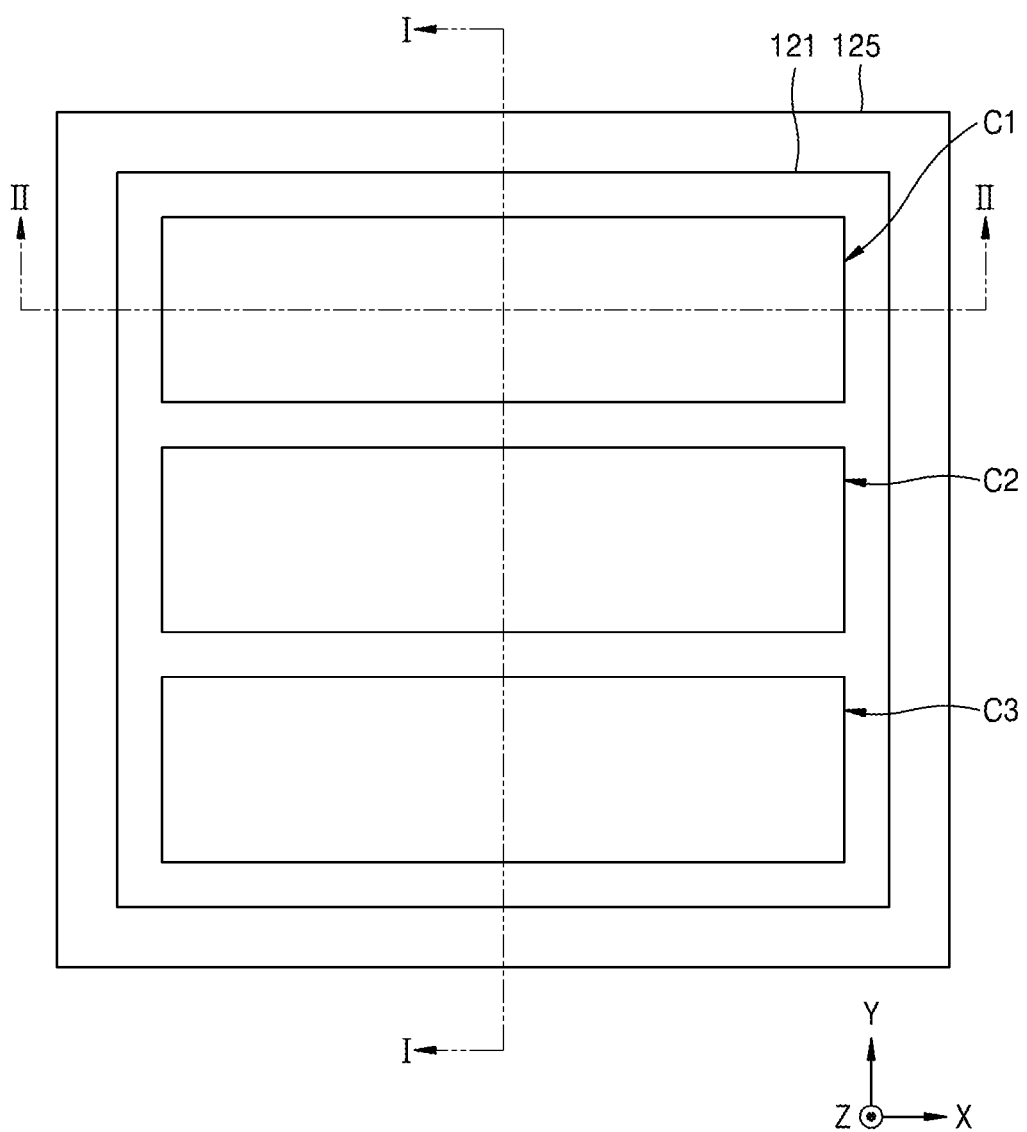
FIG. 1 is a plan view of a light-emitting device package according to some example embodiments of the inventive concepts.
Figure 2A:
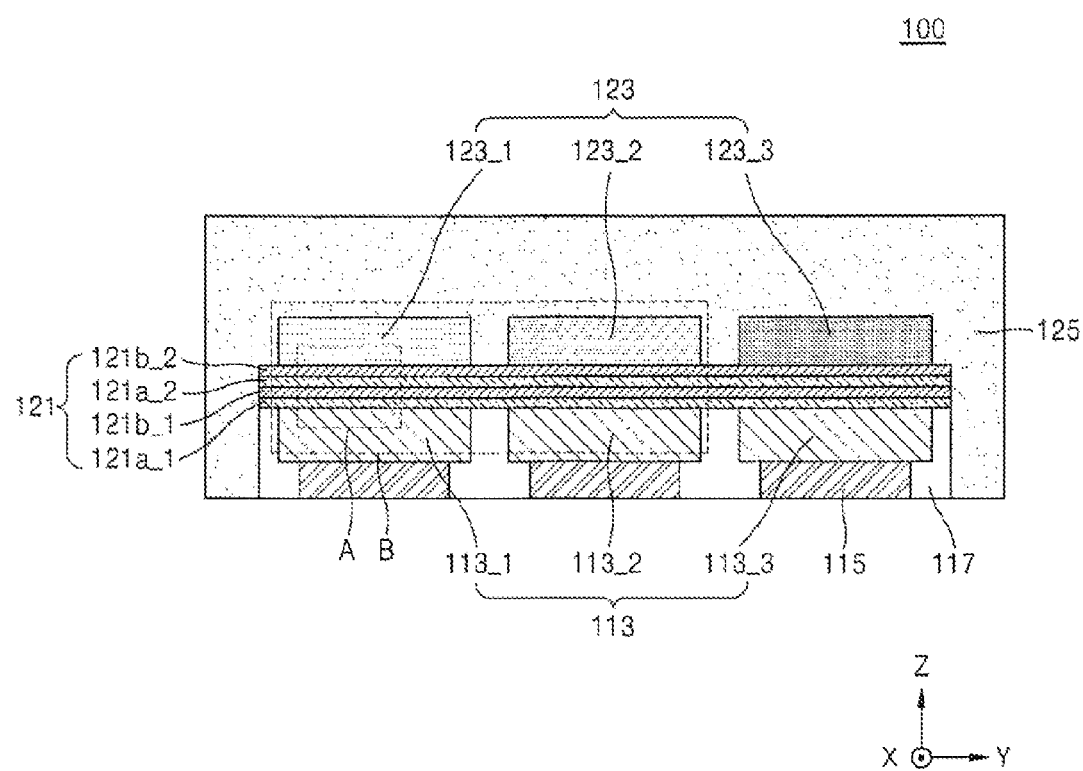
FIGS. 2A-B are cross-sectional views illustrating embodiments including a configuration corresponding to a section taken along a line I-I' of the light-emitting device of FIG. 1.
Figure 5:
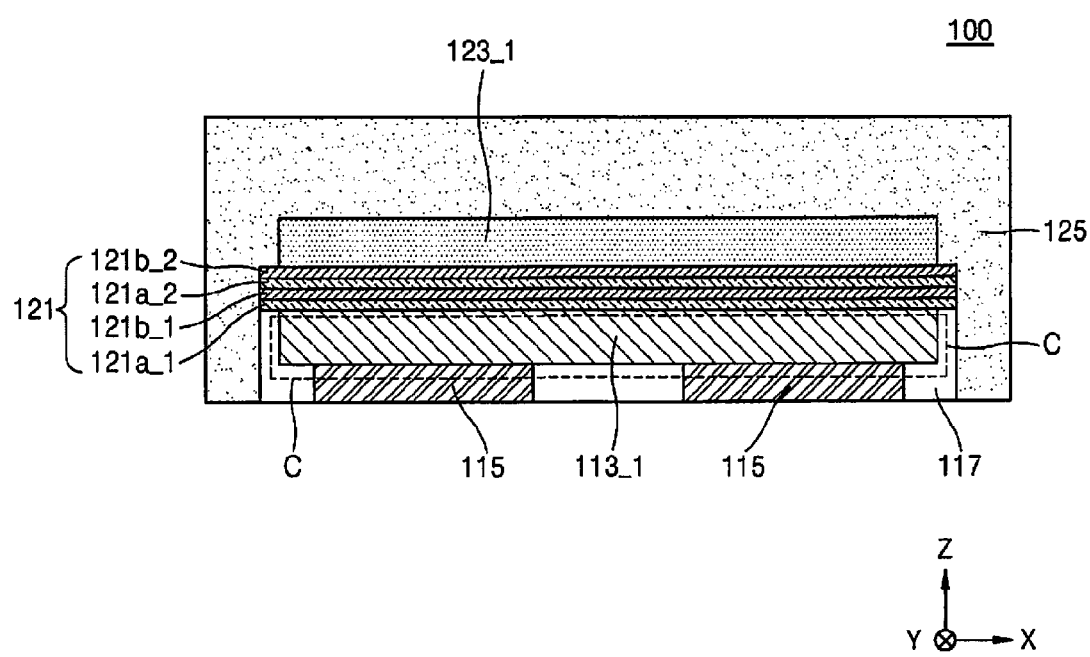
FIG. 5 is an cross-sectional view illustrating a configuration corresponding to a section taken along a line II-II' of the light-emitting device of FIG. 1.
Figure 6:
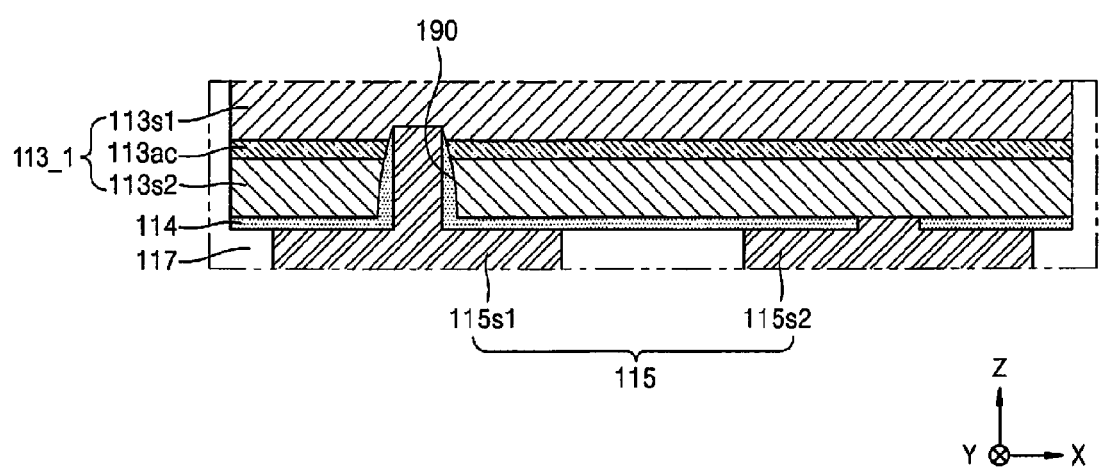
FIG. 6 is an enlarged view of a region C of FIG. 5, illustrating a luminescent structure and an electrode according to some example embodiments.

FIG. 1 is a plan view of a light-emitting device package according to some example embodiments of the inventive concepts. FIG. 2A is a cross-sectional view of a light-emitting device package 100 including a configuration corresponding to a section taken along a line I-I' of the light-emitting device of FIG. 1. FIG. 5 is a cross-sectional view of a light-emitting device package 100 including a configuration corresponding to a section taken along a line II-II' of the light-emitting device of FIG. 1. FIG. 6 is an enlarged view of a region C of FIG. 5, illustrating a luminescent structure and an electrode. Like reference numerals in the drawings denote like elements, and thus their description will be briefly described.

Referring to FIGS. 1 and 2A, the light-emitting device package 100 may include a plurality of luminescent structures 113, an electrode 115 connected to the plurality of luminescent structures 113, a first sealing member 117 surrounding the plurality of luminescent structures 113 and the electrode 115, an intermediate layer 121 formed on the plurality of luminescent structures 113 and the first sealing member 117, a wavelength conversion layer 123 formed on the intermediate layer 121, and a second sealing member 125 surrounding the intermediate layer 121 and the wavelength conversion layer 123. As used herein, the singular forms "a", "an", and "the" are intended to include the plural forms as well, unless the context clearly indicates otherwise.

The plurality of luminescent structures 113 may include first to third luminescent structures 113_1, 113_2, and 113_3. The first to third luminescent structures 113_1, 113_2, and 113_3 may be arranged spaced apart from each other in a horizontal direction (X direction). Referring to FIGS. 5 and 6, the first luminescent structure 113_1 may include a structure in which a first conductive semiconductor layer 113s1, an active layer 113ac, and a second conductive semiconductor layer 113s2 are sequentially laminated. The first and second conductive semiconductor layers 113s1 and 113s2 may be respectively connected to first and second electrodes 115s1 and 115s2, respectively. A detailed description will be provided later below with respect to FIGS. 5 and 6.

The first luminescent structure 113_1 may emit at least one of blue light, green light, red light, and ultraviolet light according to a material of a compound semiconductor at least partially comprising the first luminescent structure 113_1. In some example embodiments, a wavelength of light emitted by the first luminescent structure 113_1 may be converted by a first wavelength conversion layer 123_1 formed on the first luminescent structure 113_1, and thus, various colors of light may be output.

In some example embodiments, the second and third luminescent structures 113_2 and 113_3, having the same structure as the first luminescent structure 113_1, may emit light within the same wavelength band (also referred to herein as light having and/or associated with the same wavelength band) as light emitted by the first luminescent structure 113_1. Wavelengths, wavelength bands (e.g., wavelength spectra, wavelength ranges, etc.) of light emitted by the second and third luminescent structures 113_2 and 113_3 may be converted by second and third wavelength conversion layers 123_2 and 123_3 respectively formed on the second and third luminescent structures 113_2 and 113_3. In some example embodiments, if and/or when separate, respective beams of light within an identical or substantially identical (e.g., identical within manufacturing and material tolerances) wavelength band are emitted by each of the first to third luminescent structures 113_1, 113_2, and 113_3, the separate beams of light may be output (e.g., emitted from device 100) as light beams having different respective wavelength bands while passing through separate, respective ones of the first to third wavelength conversion layers 123_1, 123_2, and 123_3.

Each of the first to third luminescent structures 113_1, 113_2, and 113_3 may have a width that is the same or substantially the same as the width of the corresponding one of the first to third wavelength conversion layers 123_1, 123_2, and 123_3, respectively. Each of the first to third luminescent structures 113_1, 113_2, and 113_3 may have a width that is less than the width of the corresponding one of the first to third wavelength conversion layers 123_1, 123_2, and 123_3, respectively. In some example embodiments, the first to third wavelength conversion layers 123_1, 123_2, and 123_3 may cover the entire light emitting surfaces of the first to third luminescent structures 113_1, 113_2, and 113_3, respectively. A detailed description will be provided later below with respect to FIG. 9.

The first sealing member 117 may surround the plurality of luminescent structures 113 and the electrodes 115. The first sealing member 117 may have a higher Young's Modulus than the first to third luminescent structures 113_1, 113_2, and 113_3, such that the first sealing member 117 is configured to support each of the first to third luminescent structures 113_1, 113_2, and 113_3. In some example embodiments, the first sealing member 117 may include a material having higher thermal conductivity than the first to third luminescent structures 113_1, 113_2, and 113_3, such that the first sealing member 117 is configured to emit heat emitted by the first to third luminescent structures 113_1, 113_2, and 113_3. For example, the first sealing member 117 may include an epoxy resin or a silicon resin. In some example embodiments, the first sealing member 117 may include light reflecting particles such that the first sealing member 117 is configured to reflect light. Titanium dioxide ($TiO_2$) and/or aluminum oxide ($Al_2O_3$) may be used as the light reflecting particle, but the light reflecting particle is not limited thereto.

The intermediate layer 121 may be formed on the first to third luminescent structures 113_1, 113_2, and 113_3. The intermediate layer 121 may include a structure in which a plurality of layers having refractive indexes different from each other are laminated. For example, the intermediate layer 121 may have a structure including a set of alternate laminated first layer 121a_1 and second layer 121b_1 and a set of first layer 121a_2 and second layer 121b_2, but is not limited thereto. The intermediate layer 121 may also have a structure including three or more sets of three or more alternate laminated layers.

The first layers 121a_1 and 121a_2 and the second layers 121b_1 and 121b_2 may have refractive indexes different from each other since they include light-transmitting materials that are different from each other. For example, the first layers 121a_1 and 121a_2 and the second layers 121b_1 and 121b_2 may include at least one of nitride, carbide, and oxide having refractive indexes different from each other, such that the first layers 121a_1 and 121a_2 include a first light-transmitting material and the second layers 121b_1 and 121b_2 include a second light-transmitting material that is different from the first light-transmitting material. In detail, each of the first layers 121a_1 and 121a_2 and the second layers 121b_1 and 121b_2 may be two types of layers of ZrN, CrN, ZrC, ZnO, TiC, TaC, $Ga_2O_3$, $Cr_2O_3$, AlN, and GaN layers.

The first layers 121a_1 and 121a_2 and the second layers 121b_1 and 121b_2 may have refractive indexes different from each other due to a difference in void densities thereof. Since a refractive index of a void is the same as that of air, the refractive index tends to be lower as void density is higher. In some example embodiments, even the same kind of materials may have refractive indexes different from each other due to a difference in void densities thereof.

In some example embodiments, the first layers 121a_1 and 121a_2 and the second layers 121b_1 and 121b_2 may have a difference in void densities thereof as they include light-transmitting materials different from each other.

A thickness of the first layers 121a_1 and 121a_2 is similar to that of the second layers 121b_1 and 121b_2 in FIG. 1, but is not limited thereto. A thickness of the first layers 121a_1 and 121a_2 may be different from that of the second layers 121b_1 and 121b_2. In some example embodiments, thicknesses of the first layers 121a_1 and 121a_2 having an identical refractive index may be different from each other. This is also true with respect to the second layers 121b_1 and 121b_2 having an identical refractive index, as described above.

The intermediate layer 121 having the structure described above may reduce a directional angle of emitted light to be a certain angle or less. The directional angle of light indicates an angle between a direction perpendicular to a surface of the intermediate layer 121 and a traveling direction of light emitted by one of the luminescent structures 113. Light beams emitted by the first to third luminescent structures 113_1, 113_2, and 113_3 may be isotropically emitted, and light beams passing through the intermediate layer 121 on the first to third luminescent structures 113_1, 113_2, and 113_3 may travel in a low directional angle. In some example embodiments, the light beams emitted by the first to third luminescent structures 113_1, 113_2, and 113_3 may be incident to the first to third wavelength conversion layers 123_1, 123_2, and 123_3 corresponding to the first to third luminescent structures 113_1, 113_2, and 113_3, respectively. In other words, light interference may not occur between the first to third luminescent structures 113_1, 113_2, and 113_3. A detailed description will be provided later below with respect to FIG. 3.

The wavelength conversion layer 123 may be arranged on the intermediate layer 121. The wavelength conversion layer 123 may include a plurality of wavelength conversion layer components. For example, the wavelength conversion layer 123 may include the first to third wavelength conversion layers 123_1, 123_2, and 123_3. The first to third wavelength conversion layers 123_1, 123_2, and 123_3 may overlap the first to third luminescent structures 113_1, 113_2, and 113_3 in a vertical direction (Z direction), wherein the first to third wavelength conversion layers 123_1, 123_2, and 123_3 may be spaced apart from the first to third luminescent structures 113_1, 113_2, and 113_3. Such overlapping in a vertical direction may be referred to herein as vertically overlapping.

The first to third wavelength conversion layers 123_1, 123_2, and 123_3 may have a relative difference in at least one of wavelength conversion materials at least partially comprising thereof and a concentration of the wavelength conversion materials. In some example embodiments, the first to third wavelength conversion layers 123_1, 123_2, and 123_3 may respectively filter light emitted by respective luminescent structures and received at the respective wavelength conversion layers to emit light beams within wavelength bands that are different from each other (e.g., emit light beams having different wavelength bands) even if light beams within an identical wavelength band are incident to the respective first to third wavelength conversion layers 123_1, 123_2, and 123_3.

In some example embodiments, when the first to third luminescent structures 113_1, 113_2, and 113_3 emit ultraviolet (UV) light, the first wavelength conversion layer 123_1 may include a red phosphor and may transmit red light. In some example embodiments, the second wavelength conversion layer 123_2 may include a green phosphor and may transmit green light, and the third wavelength conversion layer 123_3 may include a blue phosphor and may transmit blue light. In other embodiments, when the first to third luminescent structures 113_1, 113_2, and 113_3 emit blue light, the first wavelength conversion layer 123_1 may include a red phosphor, the second wavelength conversion layer 123_2 may include a green phosphor, and the third wavelength conversion layer 123_3 may include a green phosphor having a lower concentration than that of the second wavelength conversion layer 123_2.

The first to third wavelength conversion layers 123_1, 123_2, and 123_3 may at least partially comprise materials non-resorbable by light passing through corresponding wavelength conversion layers 123_1, 123_2, and 123_3. In some example embodiments, the first to third wavelength conversion layers 123_1, 123_2, and 123_3 may include a KSF ($K_2SiF_6:Mn^{4+}$) phosphor, but are not limited thereto. The first to third wavelength conversion layers 123_1, 123_2, and 123_3 will be described at a later time below with reference to FIG. 20.

Three wavelength conversion layers respectively overlap the first to third luminescent structures 113_1, 113_2, and 113_3 in FIG. 2A, but the inventive concepts is not limited thereto. In some example embodiments, only two wavelength conversion layers, which are arranged to respectively overlap two of the first to third luminescent structures 113_1, 113_2, and 113_3, may be arranged on the intermediate layer 121. A detailed description will be provided later below with respect to FIG. 8.

At least one filter layer may further be formed on the first to third wavelength conversion layers 123_1, 123_2, and 123_3. The at least one filter layer may selectively block light within a specific range of wavelength band (e.g., within a specific wavelength spectrum) and more clearly select (e.g., selectively transmit) light within a specific wavelength band. A detailed description will be provided later below with respect to FIG. 11.

The intermediate layer 121 and the wavelength conversion layer 123 may be sealed by the second sealing member 125. The second sealing member 125 may fill spaces between the first to third wavelength conversion layers 123_1, 123_2, and 123_3.

The second sealing member 125 may at least partially comprise a material having a light transmittance of about 40% to about 100%. In particular, the second sealing member 125 may at least partially comprise a material having a visible light transmittance of about 40% to about 100%. The second sealing member 125 may at least partially comprise a mixture of a resin and a dispersing agent. In some example embodiments, a light transmittance of the second sealing member 125 may be adjusted according to a concentration of a dispersing agent (for example, carbon) included in the second sealing member 125. In some example embodiments, the second sealing member 125 may further include silicon oxide.

In some example embodiments, the second sealing member 125 may be a black resin, but is not limited thereto. The second sealing member 125 may include a transparent organic material such as a silicon resin, an epoxy resin, or a mixed resin thereof, and may be used after being cured by heating, light irradiation, or over time. The silicon resin may be methyl-based resin (e.g. polydimethylsiloxane) and phenyl-based resin (e.g. polymethylphenylsiloxane), and the methyl-based resin may be different from the phenyl-based resin with respect to a refractive index, moisture permeability, a light transmittance, light-resistance stability, or heat-resistance stability.

The second sealing member 125 may be filled between the first to third wavelength conversion layers 123_1, 123_2, and 123_3, and may be formed on the wavelength conversion layer 123. In some example embodiments, the second sealing member 125 may at least partially comprise materials having a higher light transmittance.

Generally, a light-emitting device package including a plurality of cells C1, C2, and C3 respectively emitting different colors may form a barrier configured to prevent mixing of colors between the luminescent structures 113 and the wavelength conversion layer 123. In some example embodiments, the barrier may be formed of (i.e., at least partially comprise) a material having a very low light transmittance. Light emitted by one of the cells is not leaked to neighboring cells as it is blocked by the barrier, but light extraction efficiency may be lowered as light is absorbed in the barrier. In some example embodiments, an additional photo process and etching process to form a barrier between a plurality of cells may be required, and thus, costs of manufacturing may increase.

According to some example embodiments of the inventive concepts, the light-emitting device package 100 may remove barriers between the first to third wavelength conversion layers 123_1, 123_2, and 123_3, and may introduce the intermediate layer 121 on the luminescent structures 113. The intermediate layer 121 may prevent the mixture of colors (e.g., light having certain wavelength spectra) between the luminescent structures 113 and the wavelength conversion layer 123. Simultaneously, the barriers between the first to third wavelength conversion layers 123_1, 123_2, and 123_3 may be removed, and thus, the second sealing member 125 having a proper light transmittance may be integrally formed between and on the first to third wavelength conversion layers 123_1, 123_2, and 123_3. As a result, the second sealing member 125 may be a single-piece element that extends on and at least partially between the first to third wavelength conversion layers 123_1, 123_2, and 123_3 In some example embodiments, light extraction efficiency of the light-emitting device package 100 may be improved and costs of manufacturing may be reduced based on removal of the barrier and introduction of the intermediate layer 121.

The second sealing member 125 seals side surfaces of the first sealing member 117, side surfaces and an upper surface of the intermediate layer 121, and side surfaces and an upper surface of the wavelength conversion layer 123 in FIG. 2A, but is not limited thereto.

Figure 2B:
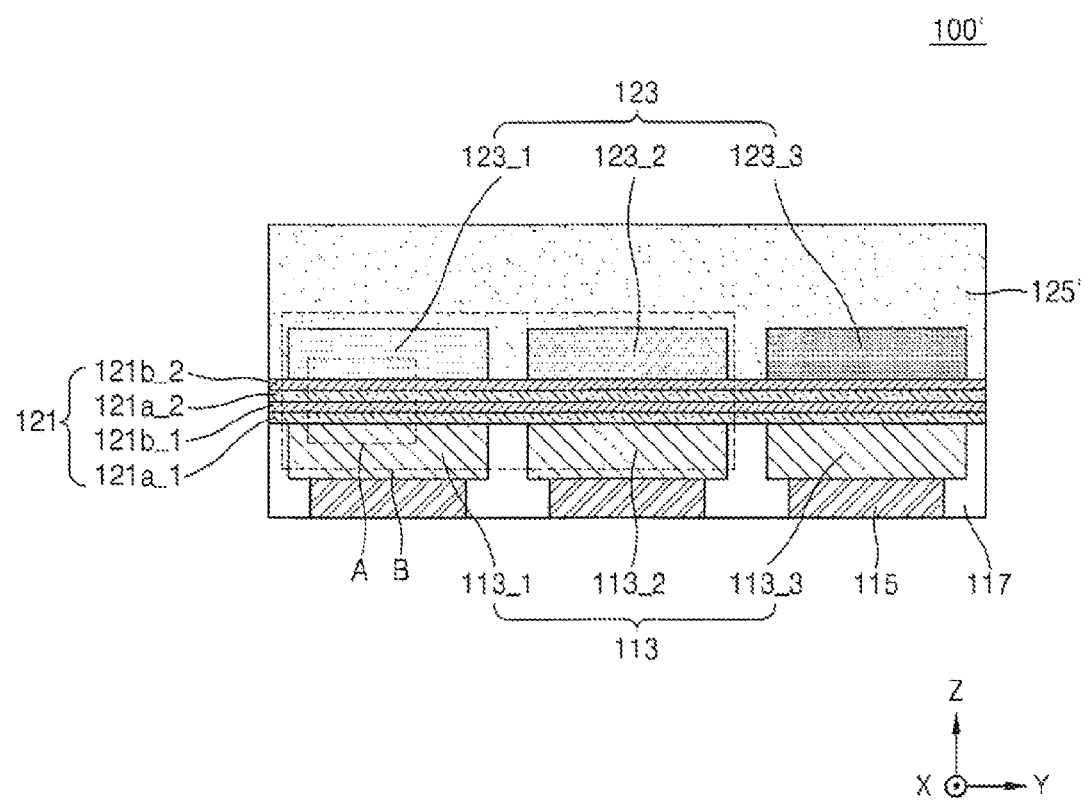

Referring to a light-emitting device package 100' of FIG. 2B, the second sealing member 125' may not seal the side surfaces of the first sealing member 117 and the intermediate layer 121.

Figure 3:
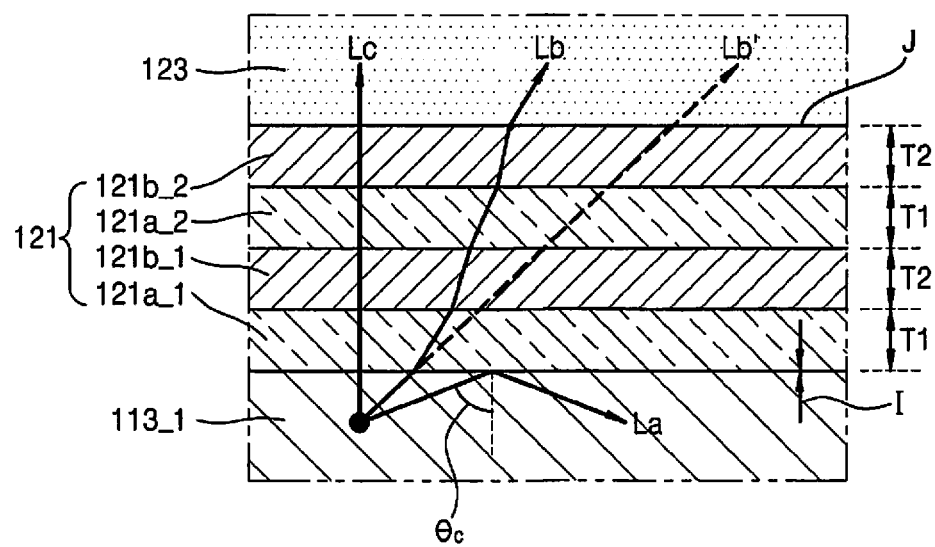
FIG. 3 is an enlarged view of a region A of FIG. 2A, illustrating a light traveling path according to some example embodiments.

FIG. 3 is an enlarged view of a region A of FIG. 2A, illustrating a light traveling path.

Referring to FIG. 3, an intermediate layer 121, in which a first layer 121a_1, a second layer 112b_1, a first layer 112a_2, and a second layer 112b_2 are sequentially laminated, may be formed on a first luminescent structure 113_1.

Referring to an interface between the first luminescent structure 113_1 and a surface I of the intermediate layer 121, light may be refracted at a prescribed angle while passing through the interface due to different refractive indexes between the first luminescent structure 113_1 and the intermediate layer 121.

Light emitted by the first luminescent structure 113_1 may be isotropically emitted, and a light beam La that is incident to the intermediate layer 121 surface I at a critical angle $\theta_c$ or larger, from among light beams incident to the intermediate layer 121, may be totally reflected without passing through the intermediate layer 121. In some example embodiments, a light beam Lc is incident to the intermediate layer 121 surface I vertically, that is, incident at zero degrees from among lights incident to the intermediate layer 121, may pass through the intermediate layer 121.

Light beam Lb incident to the intermediate layer 121 surface I at an angle larger than zero degrees and less than a total reflection critical angle $\theta_c$, from among light beams incident to the intermediate layer 121, may be refracted at a prescribed angle in the intermediate layer 121 and may be emitted from the intermediate layer surface J. In some example embodiments, the intermediate layer 121 may include the first layers 121a_1 and 121a_2 and the second layers 121b_1 and 121b_2 having refractive indexes different from each other, and an inclination of the light beam Lb passing through the first layers 121a_1 and 121a_2 and the second layers 121b_1 and 121b_2 may be larger and smaller repeatedly due to a difference in refractive indexes. In some example embodiments, a traveling path of the light beam Lb may be controlled by appropriately adjusting one or more of the refractive indexes and thicknesses of one or more of the first layers 121a_1 and 121a_2 and the second layers 121b_1 and 121b_2.

The refractive indexes and thicknesses of the first layers 121a_1 and 121a_2 and the second layers 121b_1 and 121b_2 may be determined in such a manner that the traveling path of the light beam Lb may pass through only the wavelength conversion layers 123_1, 123_2, and 123_3 corresponding to the first to third luminescent structures 113_1, 113_2, and 113_3 from which the light beam Lb is emitted. A detailed description will be provided later below with respect to FIG. 4.

Figure 4:
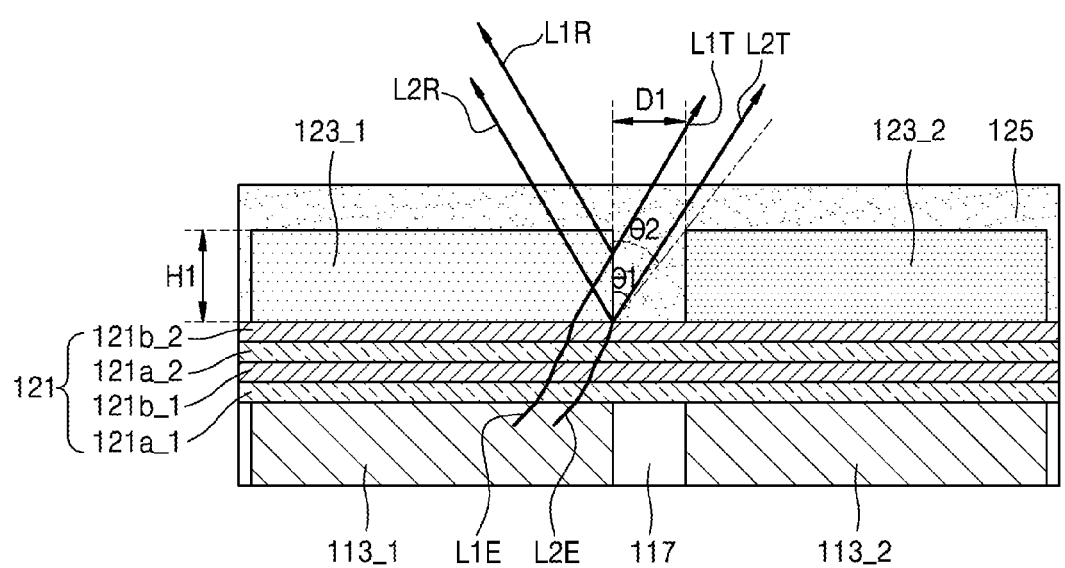
FIG. 4 is an enlarged view of a region B of FIG. 2A, illustrating a relationship between an intermediate layer and wavelength conversion layers, and a light traveling path according to some example embodiments.

FIG. 4 is an enlarged view of a region B of FIG. 2A, illustrating a relationship between an intermediate layer and wavelength conversion layers, and a light traveling path.

Referring to FIG. 4, the intermediate layer 121 is formed on the first luminescent structure 113_1 and the second luminescent structure 113_2 adjacent to the first luminescent structure 113_1. The first and second wavelength conversion layers 123_1 and 123_2, which respectively overlap the first and second luminescent structures 113_1 and 113_2 in a vertical direction (Y direction), may be arranged on the intermediate layer 121.

A first light beam L1E emitted by a center portion of the first luminescent structure 113_1 may be refracted to have a directional angle reduced by the intermediate layer 121, and may be incident to the first wavelength conversion layer 123_1. The first light beam L1E may be emitted to outside (e.g., an exterior environment relative to package 100) after being changed to a first reflected light beam L1R by the second sealing member 125 surrounding a sidewall of the first wavelength conversion layer 123_1 through wavelength conversion, or may be directly emitted to outside after being changed to a transmitted light beam LIT that is transmitted through the second sealing member 125 to the outside. In other words, as the first light beam LIE is refracted to pass through the first wavelength conversion layer 123_1 by the intermediate layer 121, light leakage to the second wavelength conversion layer 123_2 may be reduced, thereby improving light extraction efficiency of the light-emitting device package. In some example embodiments, even if a part of the first light beam LIE is incident in a direction toward the second wavelength conversion layer 123_2, light leakage may not occur as an incident angle of the first light beam L1E is a total reflection critical angle or larger. Accordingly, light extraction efficiency of the light-emitting device package may be improved.

Meanwhile, a second light beam L2E emitted by an edge of the first luminescent structure 113_1 may also be refracted to have a directional angle reduced by the intermediate layer 121, and may be incident to the first wavelength conversion layer 123_1. The second light beam L2E may be emitted to outside after being changed to a second reflected light beam L2R by the second sealing member 125, or may be directly emitted to outside after being changed to a transmitted light beam L2T that is transmitted through the second sealing member 125 to the outside.

In some example embodiments, the transmitted light beam L2T, which is a part of the second light beam L2E, may be generated near the second wavelength conversion layer 123_2 adjacent to the first wavelength conversion layer 123_1. In some example embodiments, a relationship between the intermediate layer 121 and the first and second wavelength conversion layers 123_1 and 123_2 is as given by Formula 1 below.

$$\tan \theta < D/H \quad \text{[Formula 1]}$$

θ indicates a directional angle of the second light L2E when the second light beam L2E emitted by the first luminescent structure 113_1 is emitted from the upper surface of the intermediate layer 121. D indicates a separation distance between the first and second wavelength conversion layers 123_1 and 123_2 adjacent to each other. H indicates a height of the first and second wavelength conversion layers 123_1 and 123_2 adjacent to each other.

Referring to FIG. 4, a condition of Formula 1 may include a relationship described below. A directional angle θ1 may indicate a refraction angle of light beam L2T emitted from the upper surface of the intermediate layer 121, from the second light beam L2E emitted by the first luminescent structure 113_1. The directional angle θ1 may be less than an angle θ2, which is an arctangent value of a separation distance D1 between the first and second wavelength conversion layers 123_1 and 123_2, relative to a height H1 of the first and second wavelength conversion layers 123_1 and 123_2. Therefore, in some example embodiments, the transmitted light beam L2T that deviated from the first wavelength conversion layer 123_1 may not be leaked to the second wavelength conversion layer 123_2, based at least in part upon the separation distance D1 and height H1 of the first and second wavelength conversion layers 123_1 and 123_2.

Referring to FIG. 3, it can be seen that refractive indexes and thicknesses T1 and T2 of the first layers 121a_1 and 121a_2 and the second layers 121b_1 and 121b_2 of the intermediate layer 121 may be adjusted to satisfy a condition of the directional angle θ1, such that the intermediate layer 121 is configured to refract light according to a directional angle that is less than an arctangent value of a separation distance D1 between the first and second wavelength conversion layers 123_1 and 123_2, relative to a height H1 of the first and second wavelength conversion layers 123_1 and 123_2.

The relationship in Formula 1 describes light emitted by the first luminescent structure 113_1, the intermediate layer 121, and the first and second wavelength conversion layers 123_1 and 123_2, as examples, but is not limited thereto. The relationship in Formula 1 may also be applied to relationships between light emitted by the second or third luminescent structure 113_2 or 113_3, the intermediate layer 121, and the second and third wavelength conversion layers 123_2 and 123_3.

FIG. 5 is a cross-sectional view illustrating a configuration corresponding to a section taken along a line II-II' of the light-emitting device of FIG. 1. FIG. 6 is an enlarged view of a region C of FIG. 5, illustrating a luminescent structure and an electrode.

Referring to FIGS. 5 and 6, a first luminescent structure 113_1 may include a structure in which a first conductive semiconductor layer 113s1, an active layer 113ac, and a second conductive semiconductor layer 113s2 are sequentially laminated. The first conductive semiconductor layer 113s1 may at least partially comprise a semiconductor doped with a p-type impurity, and the second conductive semiconductor layer 113s2 may at least partially comprise a semiconductor doped with an n-type impurity. The first conductive semiconductor layer 113s1 may at least partially comprise a semiconductor doped with an n-type impurity, and the second conductive semiconductor layer 113s2 may at least partially comprise a semiconductor doped with a p-type impurity. The first and second conductive semiconductor layers 113s1 and 113s2 may at least partially comprise a nitride semiconductor, for example, $Al_xIn_yGa_{(1-x-y)}N (0 \leq x < 1, 0 \leq y < 1, 0 \leq x+y < 1)$. In some example embodiments, the first and second conductive semiconductor layers 113s1 and 113s2 may at least partially comprise a GaAs semiconductor or a GaP semiconductor as well as the nitride semiconductor. The first conductive semiconductor layer 113s1, the active layer 113ac, and the second conductive semiconductor layer 113s2 may be epitaxial layers.

The active layer 113ac interposed between the first and second conductive semiconductor layers 113s1 and 113s2 may emit light having a prescribed energy by recombination of an electron and a hole. The active layer 113ac may at least partially comprise a multiple quantum well (MQW) structure in which a quantum well layer and a quantum barrier layer are alternately laminated, for example, an InGaN/GaN or AlGaN/GaN structure. In some example embodiments, the active layer 113ac may be a single quantum well (SQW) structure. The first luminescent structure 113_1 may emit blue light, green light, red light, or an ultraviolet ray according to a material of a compound semiconductor forming the first luminescent structure 113_1. In some example embodiments, by a first wavelength conversion layer 123_1 formed on the first luminescent structure 113_1, a wavelength of light emitted by the first luminescent structure 113_1 may be converted, and thus, various colors of light may be output.

The first and second conductive semiconductor layers 113s1 and 113s2 may be respectively connected to first and second electrodes 115s1 and 115s2, respectively. In detail, the first conductive semiconductor layer 113s1 may be exposed by a through hole 190 penetrating through the second conductive semiconductor layer 113s2 and the active layer 113ac. In a space limited by an insulating film 114 in the through hole 190, the first electrode 115s1 may be formed to be connected to the first conductive semiconductor layer 113s1. The insulating film 114 may be formed on an inner wall of the through hole 190 and a lower surface of the second conductive semiconductor layer 113s2, and thus, may prevent a direct electrical connection between the first electrode 115s1, the active layer 113ac, and the second electrode 115s2. In some example embodiments, the second conductive semiconductor layer 113s2 may penetrate through the insulating film 114 formed on the second conductive semiconductor layer 113s2 and may be connected to the second electrode 115s2.

Side surfaces of the first and second electrodes 115s1 and 115s2 may be covered by the first sealing member 117, but a lower surface the first and second electrodes 115s1 and 115s2 may be exposed outwardly. The lower surface of the first and second electrodes 115s1 and 115s2 may be electrically connected to a substrate (not shown) on which the light-emitting device package 100 is mounted.

The first and second electrodes 115s1 and 115s2 of the light-emitting device package 100 are formed in the same plane, but are not limited thereto. The first and second electrodes 115s1 and 115s2 may be arranged in various shapes.

In some example embodiments, the first and second electrodes 115s1 and 115s2 may include silver (Ag), nickel (Ni), aluminum (Al), rhodium (Rh), palladium (Pd), iridium (Ir), ruthenium (Ru), magnesium (Mg), zinc (Zn), platinum (Pt), or gold (Au), and may have a structure including at least two layers such as a Ni/Ag, Zn/Ag, Ni/Al, Zn/Al, Pd/Ag, Pd/Al, or Ir/Ag. In some example embodiments, the first and second electrodes 115s1 and 115s2 may include a seed layer formed of Ni or chromium (Cr), and may at least partially comprise an electrode material such as Au by using a plating process.

The first and second conductive semiconductor layers 113s1 and 113s2, the active layer 113ac, the insulating film 114, and the first and second electrodes 115s1 and 115s2 of FIG. 6 are examples of an electrical connection structure of the first luminescent structure 113_1 and the electrode 115, but the inventive concepts are not limited thereto. In some example embodiments, the first luminescent structure 113_1 may emit light having a prescribed energy, and the electrode 115, which may include various structures, may transmit the prescribed energy to the first luminescent structure 113_1.

FIG. 5 illustrates only a section structure of the first cell C1 of FIG. 1, but the second and third cells C2 and C3 may also have the same structure as that of the first cell C1. Similarly, FIG. 6 illustrates only the first luminescent structure 113_1, but the second and third luminescent structures 113_2 and 113_3 may also have the same structure as that of the first luminescent structure 113_1.

The intermediate layer 121 may be formed on the first to third luminescent structures 113_1, 113_2, and 113_3. The wavelength conversion layer 123 may include the first to third wavelength conversion layers 123_1, 123_2, and 123_3. The first to third wavelength conversion layers 123_1, 123_2, and 123_3 may overlap the first to third luminescent structures 113_1, 113_2, and 113_3, respectively. In some example embodiments, the overlapping region of the first luminescent structure 113_1 and the first wavelength conversion layer 123_1 may form the first cell C1, from among the first luminescent structure 113_1, the first wavelength conversion layer 123_1, and the intermediate layer 121. Similarly, the overlapping region of the second luminescent structure 113_2 and the second wavelength conversion layer 123_2 may form the second cell C2, from among the second luminescent structure 113_2, the second wavelength conversion layer 123_2, and the intermediate layer 121. In some example embodiments, the overlapping region of the third luminescent structure 113_3 and the third wavelength conversion layer 123_3 may form the third cell C3, from among the third luminescent structure 113_3, the third wavelength conversion layer 123_3, and the intermediate layer 121.

Figure 7:
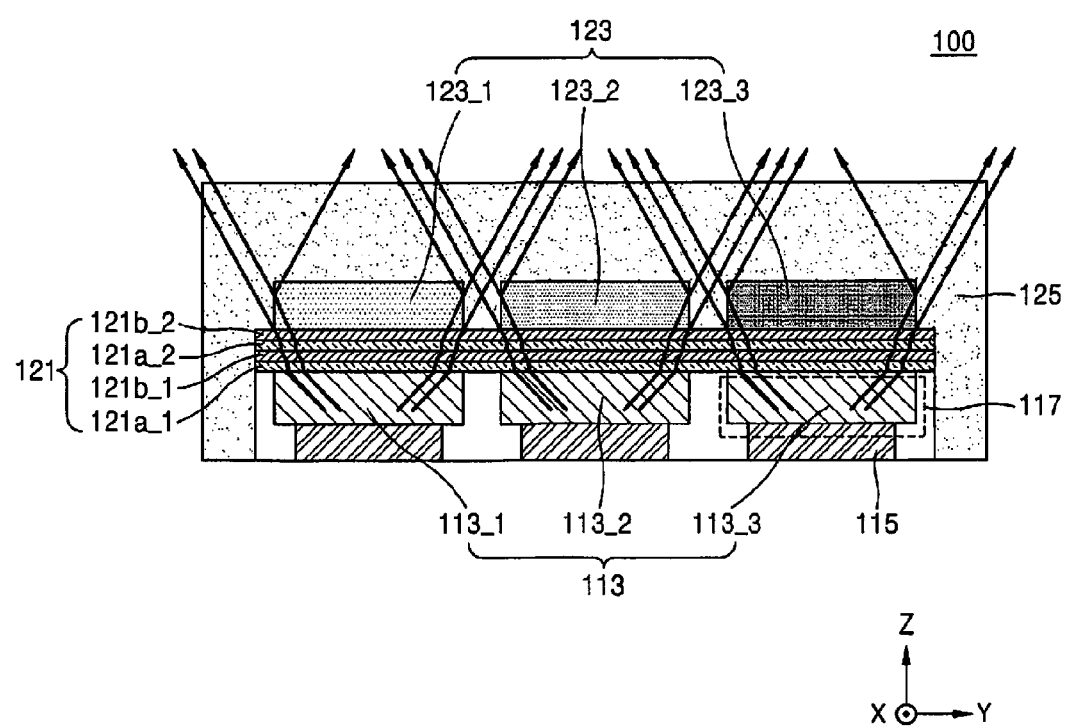
FIG. 7 is an cross-sectional view illustrating a light traveling path of the light-emitting device package of FIG. 1.

FIG. 7 is a cross-sectional view illustrating a light traveling path of light beams emitted by separate luminescent structures of the light-emitting device package of FIG. 1.

Referring to FIG. 7, as described above in FIGS. 3 and 4, the package may be configured to direct transmitted light beams that deviate in propagation path from the first to third wavelength conversion layers 123_1, 123_2, and 123_3, from among light beams respectively emitted by the first to third luminescent structures 113_1, 113_2, and 113_3, to avoid intersecting the adjacent wavelength conversion layers 123_1, 123_2, and 123_3, such that the light beams are excluded from leaking to the adjacent wavelength conversion layers, thereby improving light extraction efficiency of the light-emitting device package.

Referring to FIGS. 1 and 2A, light respectively emitted by the first to third luminescent structures 113_1, 113_2, and 113_3 in the first to third cells C1, C2, and C3 may be adjusted to pass through only the wavelength conversion layers 123_1, 123_2, and 123_3 in the first to third cells C1, C2, and C3, and thus, an operation of each of the first to third cells C1, C2, and C3 may be independent.

For example, as shown in FIG. 7, a directional angle of light emitted by the first luminescent structure 113_1 of the first cell C1 may be smaller as the light passes through the intermediate layer 121. In some example embodiments, a part of the light emitted by the first luminescent structure 113_1 of the first cell C1 may not be incident to the first wavelength conversion layer 123_1 of the first cell C1 but may not be incident to the second wavelength conversion layer 123_2 of the second cell C2, and thus, light emitted by a luminescent structure that is separate from the luminescent structure 113_2 of the second cell C2 may be prevented from being emitted from the second cell C2.

Figure 8:
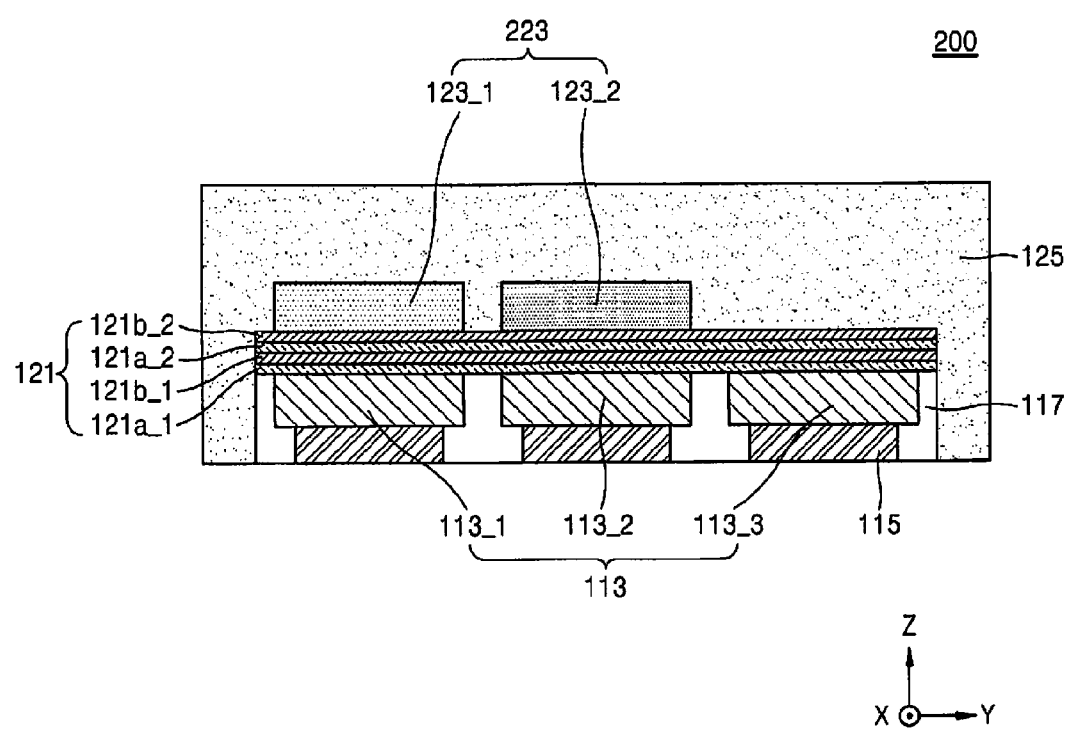
FIG. 8, FIG. 9, FIG. 10, FIG. 11, and FIGS. 12A-B, are cross-sectional views of light-emitting device packages according to some example embodiments of the inventive concepts.

FIG. 8 is a cross-sectional view of a light-emitting device package 200 according to some example embodiments of the inventive concepts. The light-emitting device package 200 is similar to the light-emitting device package 100 of FIG. 1 except that a wavelength conversion layer is not formed on a third luminescent structure 113_3. In FIG. 8, like reference numerals in FIG. 1 denote like elements, and redundant descriptions will be omitted for simplicity.

Referring to FIG. 8, an intermediate layer 121 may be formed on first to third luminescent structures 113_1, 113_2, and 113_3, and first and second wavelength conversion layers 123_1 and 123_2 may overlap the first and second luminescent structures 113_1 and 113_2, wherein the first and second wavelength conversion layers 123_1 and 123_2 may be spaced apart from the first and second luminescent structures 113_1 and 113_2.

The first to third luminescent structures 113_1, 113_2, and 113_3 may emit blue light beams (e.g., light beams having a wavelength spectrum within a blue wavelength spectrum). In some example embodiments, the first wavelength conversion layer 123_1 may include a red phosphor and the second wavelength conversion layer 123_2 may include a green phosphor. In some example embodiments, the blue light beams emitted by the first luminescent structure 113_1 may be emitted as red light by passing through the red phosphor of the first wavelength conversion layer 123_1. In some example embodiments, the blue light beams emitted by the second luminescent structure 113_2 may be emitted as green light by passing through the green phosphor of the second wavelength conversion layer 123_2. The blue light beams emitted by the third luminescent structure 113_3 may not be changed as being emitted without passing through any wavelength conversion layer.

Figure 9:
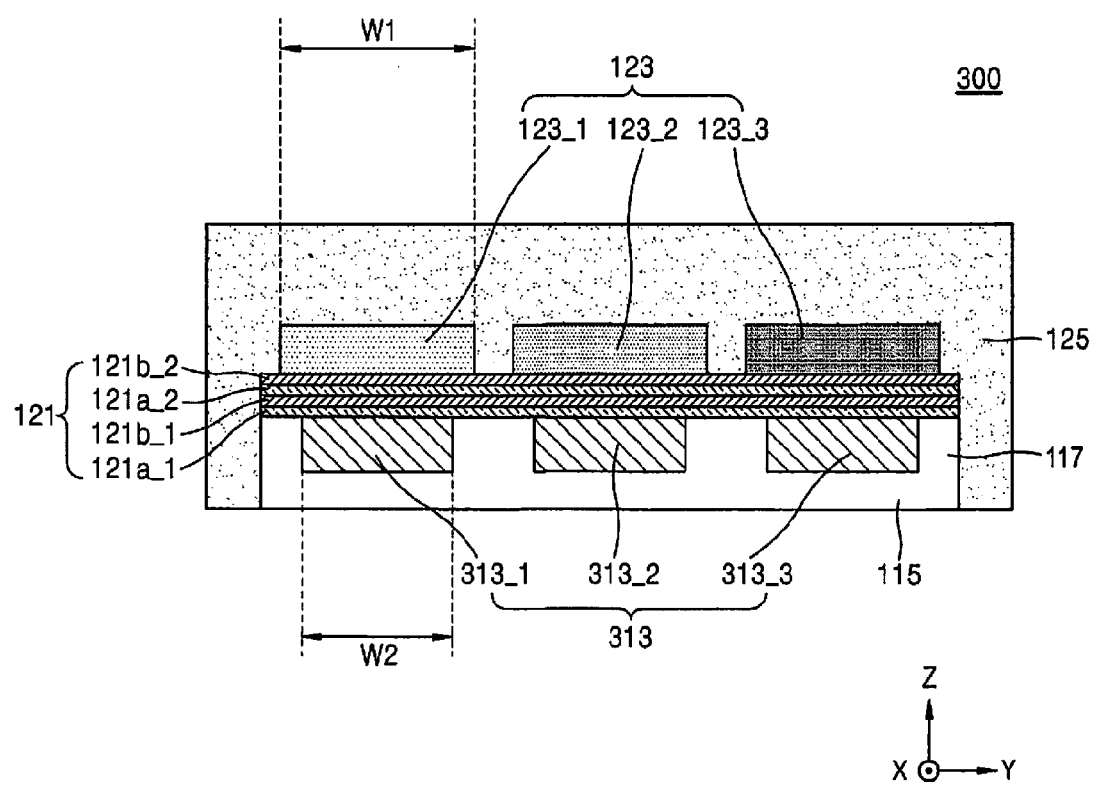

FIG. 9 is a cross-sectional view of a light-emitting device package 300 according to some example embodiments of the inventive concepts. The light-emitting device package 300 is similar to the light-emitting device package 100 of FIG. 1 except that widths of first to third luminescent structures 313_1, 313_2, and 313_3 are different from those of first to third wavelength conversion layers 123_1, 123_2, and 123_3, respectively.

Referring to FIG. 9, an intermediate layer 121 may be formed on first to third luminescent structures 313_1, 313_2, and 313_3, and first to third wavelength conversion layers 123_1, 123_2, and 123_2 may overlap the first to third luminescent structures 313_1, 313_2, and 313_3, wherein the first to third wavelength conversion layers 123_1, 123_2, and 123_2 may be spaced apart from the first to third luminescent structures 313_1, 313_2, and 313_3.

The widths W1 of the first to third wavelength conversion layers 123_1, 123_2, and 123_3 may be larger than the widths W2 of the first to third luminescent structures 313_1, 313_2, and 313_3. In some example embodiments, the first to third wavelength conversion layers 123_1, 123_2, and 123_3 may cover the entire light emitting surfaces of the first to third luminescent structures 313_1, 313_2, and 313_3 with space (e.g., as shown in FIG. 9, some portions of the first to third wavelength conversion layers may extend beyond overlapping respective ones of the first to third luminescent structures), respectively. In other words, as the widths W2 of the first to third luminescent structures 313_1, 313_2, and 313_3 are relatively small, separation distances between the first to third luminescent structures 313_1, 313_2, and 313_3 are relatively larger, and thus, the first to third luminescent structures 313_1, 313_2, and 313_3 may be less affected by each other by light beams emitted by the first to third luminescent structures 313_1, 313_2, and 313_3. Restated, the separation distances between the first to third luminescent structures 313_1, 313_2, and 313_3 may be inversely proportional to the widths W2 of the first to third luminescent structures 313_1, 313_2, and 313_3.

Figure 10:
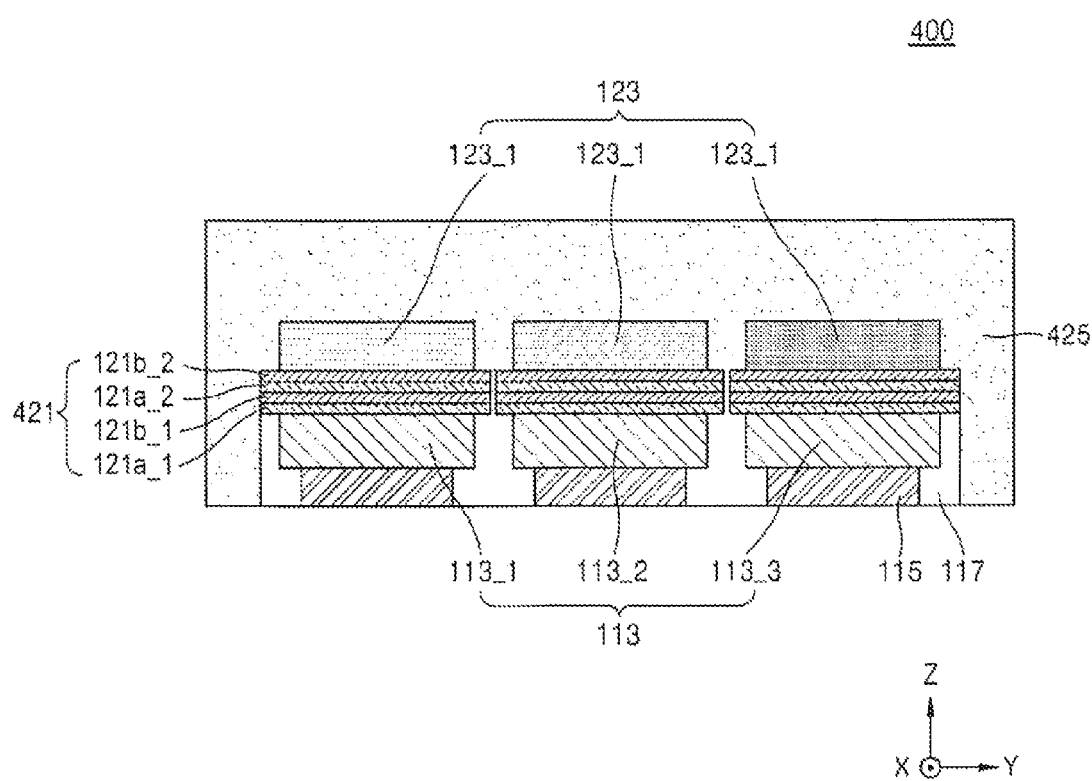

FIG. 10 is a cross-sectional view of a light-emitting device package 400 according to some example embodiments of the inventive concepts. The light-emitting device package 400 is similar to the light-emitting device package 100 of FIG. 1 except that intermediate layers 421 are included, which are divided into three separate intermediate layers 421, on separate, respective ones of the first to third luminescent structures 113_1, 113_2, and 113_3.

Referring to FIG. 10, the intermediate layers 421 may be mounted on the first to third luminescent structures 113_1, 113_2, and 113_3, respectively. The intermediate layers 421 may be formed to cover the entire surfaces of the first to third luminescent structures 113_1, 113_2, and 113_3, respectively.

First to third wavelength conversion layers 123_1, 123_2, and 123_3 may be arranged on the intermediate layers 421.

A second sealing member 425 may be formed to seal side surfaces of and spaces between the intermediate layers 421, side surfaces and upper surfaces of the first to third wavelength conversion layers 123_1, 123_2, and 123_3, and spaces between the first to third wavelength conversion layers 123_1, 123_2, and 123_3.

Figure 11:
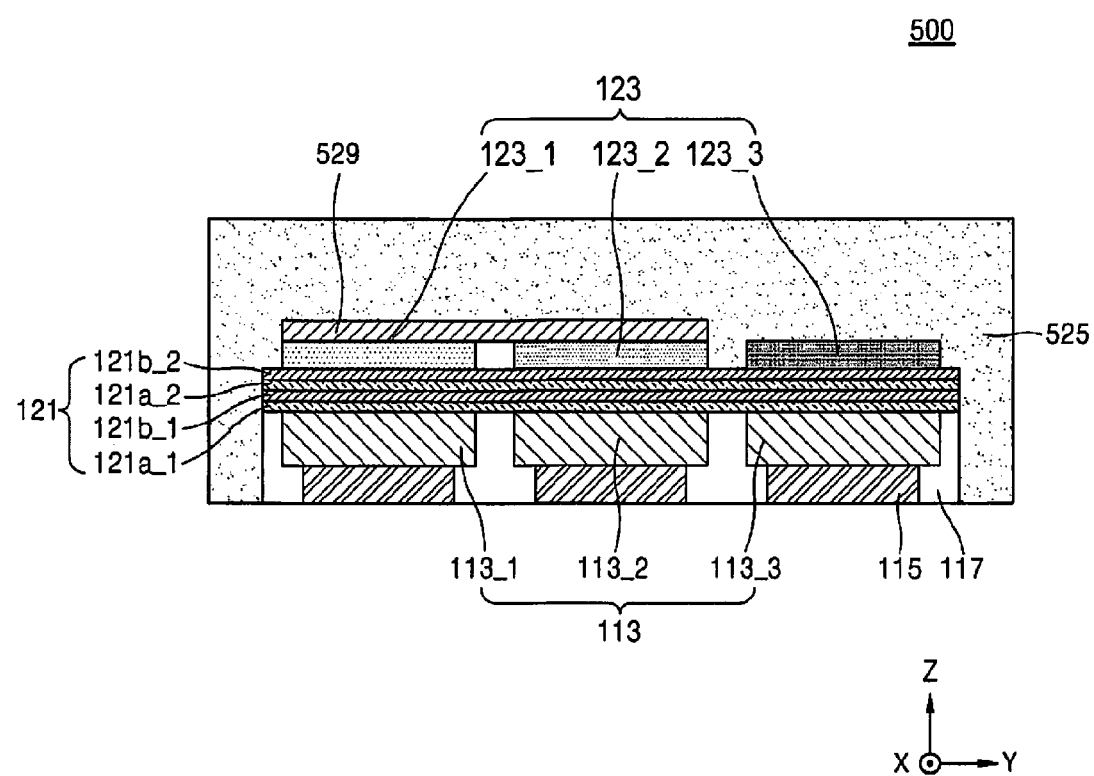

FIG. 11 is a cross-sectional view of a light-emitting device package 500 according to some example embodiments of the inventive concepts. The light-emitting device package 500 is similar to the light-emitting device package 100 of FIG. 1 except that a filter layer 529 is further included.

Referring to FIG. 11, the light-emitting device package 500 may include a plurality of luminescent structures 113, an electrode 115 connected to the plurality of luminescent structures 113, a first sealing member 117 surrounding the plurality of luminescent structures 113 and the electrode 115, an intermediate layer 121 formed on the plurality of luminescent structures 113 and the first sealing member 117, wavelength conversion layers 123 including first to third wavelength conversion layers 123_1, 123_2 and 123_3 formed on the intermediate layer 121, a filter layer 529 formed on the first and second wavelength conversion layers 123_1 and 123_2, and a second sealing member 525 surrounding the intermediate layer 121, the first to third wavelength conversion layers 123_1, 123_2 and 123_3, and the filter layer 529.

The filter layer 529 may selectively block or more clearly filter light within a specific wavelength band.

The plurality of luminescent structures 113 may include first to third luminescent structures 113_1, 113_2, and 113_3, and the first to third luminescent structures 113_1, 113_2, and 113_3 may emit blue lights. The first wavelength conversion layer 123_1 may include a red phosphor, the second wavelength conversion layer 123_2 may include a green phosphor, and the third wavelength conversion layer 123_3 may include a green phosphor having a lower concentration than the concentration of green phosphor in the second wavelength conversion layer 123_2. The filter layer 529 may be further formed on the first and second wavelength conversion layers 123_1 and 123_2 formed over the first and second luminescent structures 113_1 and 113_2. The filter layer 529 may selectively block the blue light beams emitted from the first and second luminescent structures 113_1 and 113_2. In some example embodiments, light beams emitted by the first and second luminescent structures 113_1 and 113_2 and respectively passing through the first and second wavelength conversion layers 123_1 and 123_2 may be more clear red and green lights, respectively.

FIG. 11 illustrates the filter layer 529 arranged on the first and second wavelength conversion layers 123_1 and 123_2, but the inventive concepts are not limited thereto. In some example embodiments, at least one filter layer may be arranged on at least one of the first to third wavelength conversion layers 123_1, 123_2, and 123_3. For example, when the first to third luminescent structures 113_1, 113_2, and 113_3 emit a UV light beam, the first wavelength conversion layer 123_1 may include a red phosphor, the second wavelength conversion layer 123_2 may include a green phosphor, and the third wavelength conversion layer 123_3 may include a blue phosphor. In some example embodiments, a filter layer may be arranged on the first to third wavelength conversion layers 123_1, 123_2, and 123_3, and may selectively block the UV light emitted from the first to third luminescent structures 113_1, 113_2, and 113_3, and may transmit red, green, and blue light beams respectively emitted from the first to third wavelength conversion layers 123_1, 123_2, and 123_3.

Figure 12A:
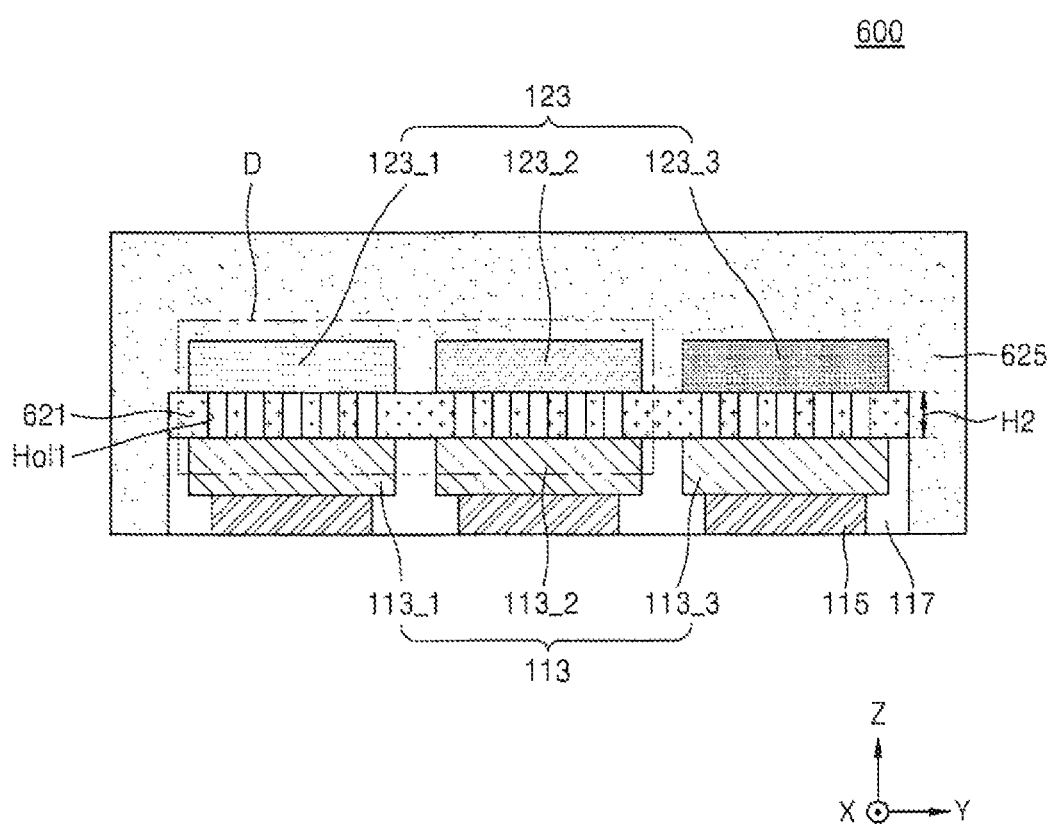
Figure 12B:
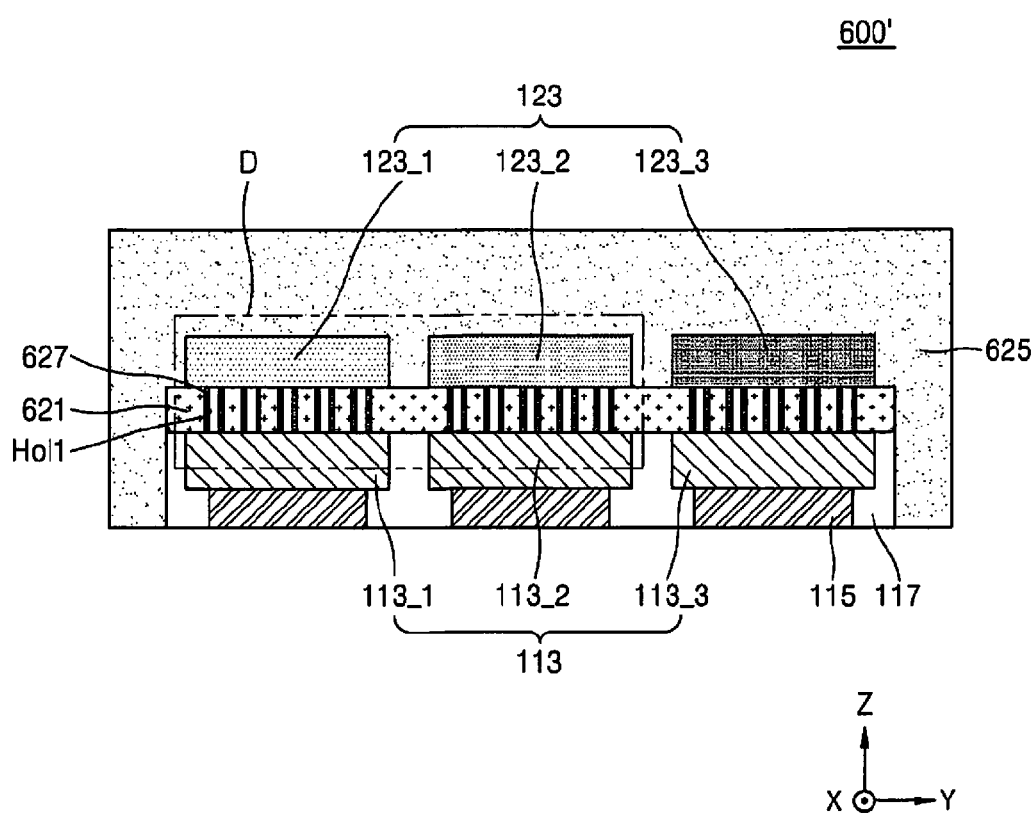

FIGS. 12A and 12B are cross-sectional views of light-emitting device packages 600 and 600' according to some example embodiments of the inventive concepts. The light-emitting device packages 600 and 600' are similar to the light-emitting device package 100 of FIG. 1 except for a structure of an intermediate layer 621.

Referring to FIG. 12A, the light-emitting device package 600 may include a plurality of luminescent structures 113, an electrode 115 connected to the plurality of luminescent structures 113, a first sealing member 117 surrounding the plurality of luminescent structures 113 and the electrode 115, an intermediate layer 621 formed on the plurality of luminescent structures 113 and the first sealing member 117, first to third wavelength conversion layers 123_1, 123_2 and 123_3 formed on the intermediate layer 621, and a second sealing member 625 surrounding the intermediate layer 621 and the first to third wavelength conversion layers 123_1, 123_2 and 123_3.

The intermediate layer 621 may have a structure including a plurality of holes Hol1. In detail, the plurality of holes Hol1 may be formed in a region where the plurality of luminescent structures 113 and the intermediate layer 621 overlap each other. In some example embodiments, the holes Hol1 may not be formed in sections of the intermediate layer 621 overlapping spaces between the adjacent luminescent structures, that is, a space between first and second luminescent structures 113_1 and 113_2, and/or a space between the second and third luminescent structures 113_2 and 113_3.

By appropriately adjusting a height H2 of the intermediate layer 621 and structures of the holes Hol1, traveling paths of light beams emitted by the first to third luminescent structures 113_1, 113_2, and 113_3 may be controlled. In some example embodiments, the light beams emitted by the first to third luminescent structures 113_1, 113_2, and 113_3 may be controlled to pass through only the first to third wavelength conversion layers 123_1, 123_2, and 123_3 corresponding to the first to third luminescent structures 113_1, 113_2, and 113_3, respectively. A detailed description will be provided later below with respect to FIG. 13.

The light-emitting device package 600' of FIG. 12B is the same as the light-emitting device package 600 of FIG. 12A, except that a reflective layer 627 in a plurality of holes Hol1 is further included. The reflective layer 627 may improve light extraction efficiency by reflecting light passing through the holes Hol1 in order not to be absorbed in the intermediate layer 621.

The reflective layer 627 may be a metal layer. For example, the reflective layer 627 may be a metal including at least one of Al, Ag or titanium (Ti), an alloy or a mixture thereof, etc.

Figure 13:
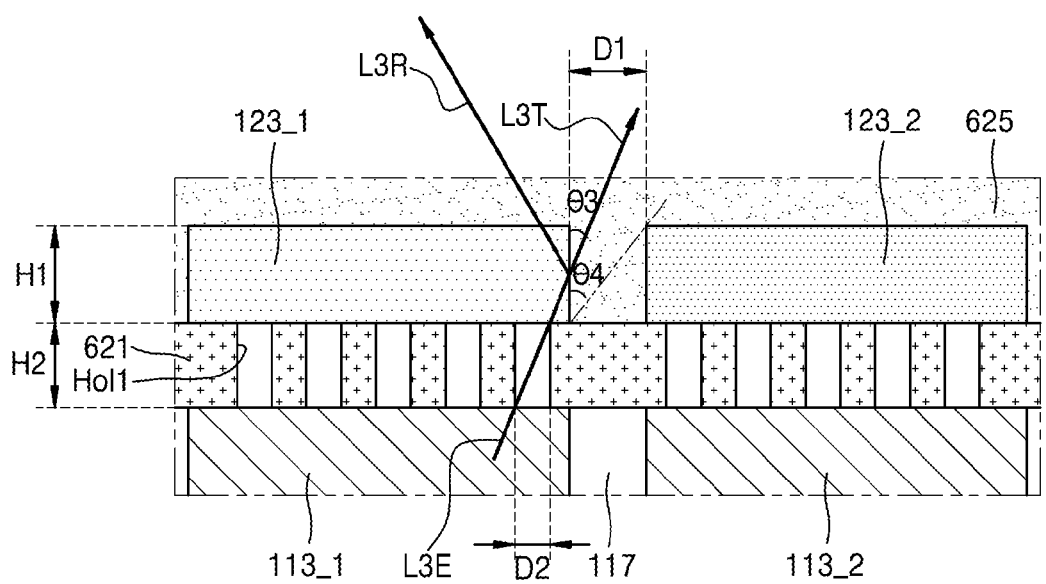
FIG. 13 is an enlarged view of a region D of FIG. 12A, illustrating a relationship between an intermediate layer and wavelength conversion layers, and a light traveling path.

FIG. 13 is an enlarged view of a region D of FIG. 12A, illustrating a relationship between the intermediate layer 621 and the first and second wavelength conversion layers 123_1 and 123_2, and a light traveling path.

Referring to FIG. 13, the intermediate layer 621 is formed on the first luminescent structure 113_1 and the second luminescent structure 113_2 adjacent to the first luminescent structure 113_1. The first and second wavelength conversion layers 123_1 and 123_2, which respectively overlap the first and second luminescent structures 113_1 and 113_2 in a vertical direction (Z direction), may be arranged on the intermediate layer 621.

A light beam L3E emitted by an edge of the first luminescent structure 113_1 may be refracted to have a directional angle reduced by the intermediate layer 621, and may be incident to the first wavelength conversion layer 123_1. The light beam L3E may be emitted to outside (e.g., emitted to an external environment that is exterior to the light-emitting device package) after being changed to a reflected light beam L3R by the second sealing member 625, or may be directly emitted to outside after being changed to a transmitted light beam L3T that is transmitted through the second sealing member 625 to the outside.

In some example embodiments, the transmitted light beam L3T may be generated near the second wavelength conversion layer 123_2 adjacent to the first wavelength conversion layer 123_1. In some example embodiments, a relationship between the intermediate layer 621 and the first and second wavelength conversion layers 123_1 and 123_2 is as given by Formula 2 below.

$$\tan^{-1}(D2/H2) < \tan^{-1}(D1/H1)$$ [Formula 2]

D1 indicates a separation distance between the adjacent first and second wavelength conversion layers 123_1 and 123_2, H1 indicates a height of the first and second wavelength conversion layers 123_1 and 123_2, D2 indicates a diameter of each of the holes Hol1, and H2 indicates a depth of each of the holes Hol1.

Referring to FIG. 13, a condition of Formula 2 may include a relationship described below. An angle θ3, which is an arctangent value of a diameter D2 of each of the holes Hol1 relative to a depth H2 of each of the holes Hol1, may be less than an angle θ4, which is an arctangent value of a separation distance D1 between the first and second wavelength conversion layers 123_1 and 123_2, relative to the height H1 of the first and second wavelength conversion layers 123_1 and 123_2. In some example embodiments, the transmitted light beam L3T that deviated from the first wavelength conversion layer 123_1 may not be leaked to the second wavelength conversion layer 123_2, thereby improving light extraction efficiency of the light-emitting device package.

The relationship in Formula 2 describes light beams emitted by the first luminescent structure 113_1, the intermediate layer 621, and the first and second wavelength conversion layers 123_1 and 123_2, as examples, but is not limited thereto. The relationship in Formula 2 may also be applied to relationships between light beams emitted by the second or third luminescent structure 113_2 or 113_3, the intermediate layer 621, and the second and third wavelength conversion layers 123_2 and 123_3.

Figure 14:
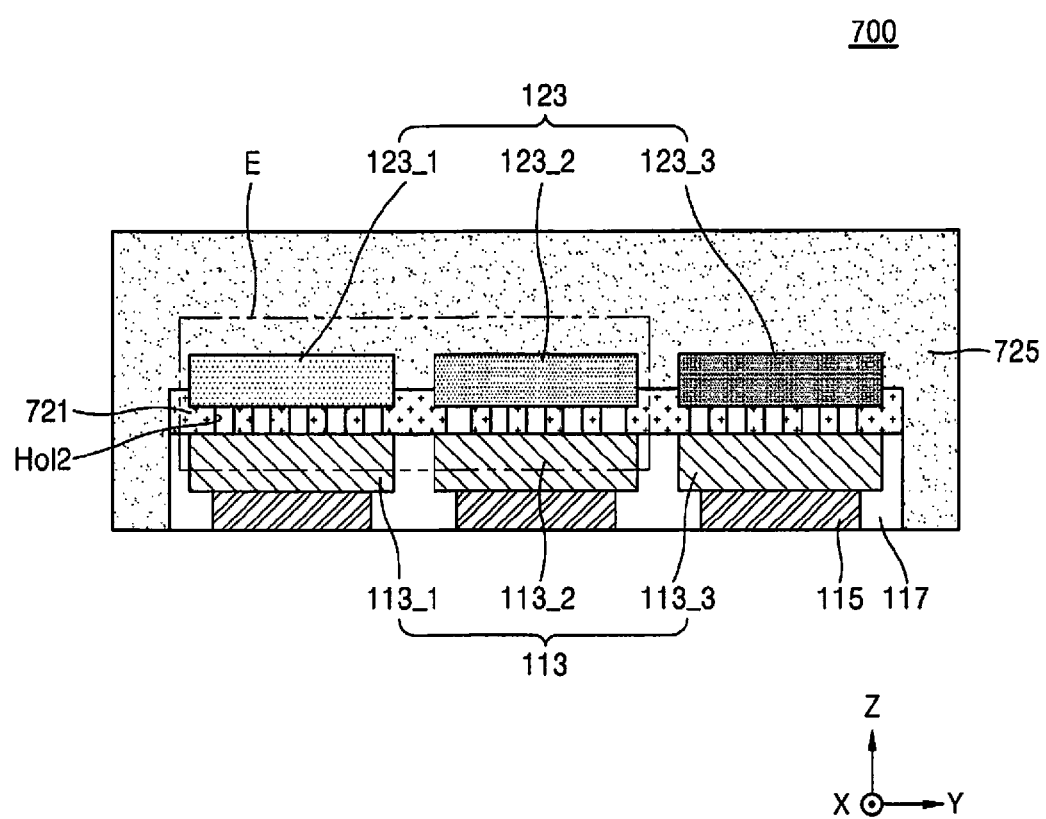
FIG. 14 is a cross-sectional view of a light-emitting device package according to some example embodiments of the inventive concepts.

FIG. 14 is a cross-sectional view of a light-emitting device package 700 according to some example embodiments of the inventive concepts. The light-emitting device package 700 is similar to the light-emitting device package 600 of FIG. 12A except for variations in a level of an upper surface of an intermediate layer 721.

Referring to FIG. 14, the intermediate layer 721 including a plurality of holes Hol2 may be formed on first to third luminescent structures 113_1, 113_2, and 113_3.

The holes Hol2 may be formed in a region where the plurality of luminescent structures 113 and the intermediate layer 721 overlap each other. In some example embodiments, the holes Hol2 may not be formed in sections of the intermediate layer 721 overlapping spaces between the adjacent luminescent structures, that is, a space between first and second luminescent structures 113_1 and 113_2, and/or a space between the second and third luminescent structures 113_2 and 113_3.

In some example embodiments, the upper surface of the intermediate layer 721 may be located in different levels. For example, in the intermediate layer 721, an upper surface of a first section overlapping the plurality of luminescent structures 113 may have a first level, and an upper surface of a second section not overlapping the plurality of luminescent structures 113 may have a second level, wherein the second level may be higher than the first level.

First to third wavelength conversion layers 123_1, 123_2, and 123_3, overlapping separate, respective ones of the plurality of luminescent structures 113_1, 113_2, and 113_3, may be arranged in the first section having a lower level in the intermediate layer 721. In some example embodiments, at least a part of side surfaces of the first to third wavelength conversion layers 123_1, 123_1, and 123_3 may be surrounded by the second section in the intermediate layer 721.

A remaining part of the side surfaces of the first to third wavelength conversion layers 123_1, 123_1, and 123_3, which is not surrounded by the intermediate layer 721, may be surrounded by a second sealing member 725 sealing the intermediate layer 721 and the wavelength conversion layer 123. A detailed description will be provided later below with respect to FIG. 15.

Figure 15:
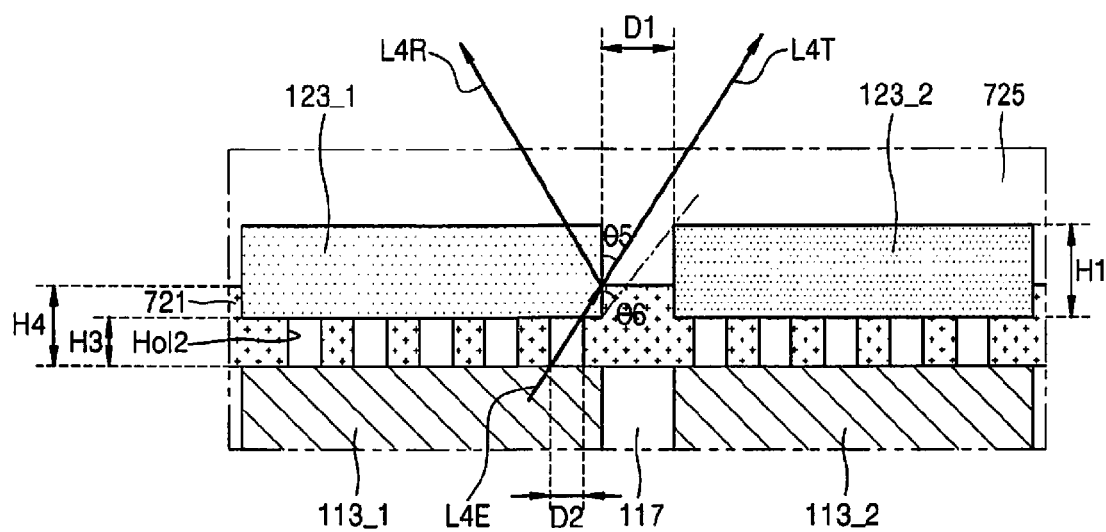
FIG. 15 is an enlarged view of a region E of FIG. 14, illustrating a relationship between an intermediate layer and wavelength conversion layers, and a light traveling path.

FIG. 15 is an enlarged view of a region E of FIG. 14, illustrating a relationship between the intermediate layer 721 and the first and second wavelength conversion layers 123_1 and 123_2, and a light traveling path.

Referring to FIG. 15, in the intermediate layer 721, an upper surface of a first section overlapping the first and second luminescent structures 113_1 and 113_2 may have a first level H3, and an upper surface of a second section not overlapping the first and second luminescent structures 113_1 and 113_2 may have a second level H4, wherein the second level H4 may be higher than the first level H3. The first and second wavelength conversion layers 123_1 and 123_2, respectively overlapping the first and second luminescent structures 113_1 and 113_2, may be arranged in the first section having the first level H3 in the intermediate layer 721.

A light beam L4E emitted by an edge of the first luminescent structure 113_1 may be refracted to have a directional angle reduced by the intermediate layer 721, and may be incident to the first wavelength conversion layer 123_1. The light beam L4E may be emitted to outside after being changed to a reflected light beam L4R by the second sealing member 725, or may be directly emitted to outside after being changed to a transmitted light beam L4T transmitting the second sealing member 725.

In some example embodiments, the transmitted light beam L4T may be generated near the second wavelength conversion layer 123_2 adjacent to the first wavelength conversion layer 123_1. In some example embodiments, a relationship between the intermediate layer 721 and the first and second wavelength conversion layers 123_1 and 123_2 is as given by Formula 3 below.

$$\tan^{-1}(D2/H3) < \tan^{-1}(D1/H1) \quad \text{[Formula 3]}$$

D1 indicates a separation distance between the adjacent first and second wavelength conversion layers 123_1 and 123_2, H1 indicates a height of the first and second wavelength conversion layers 123_1 and 123_2, D2 indicates a diameter of each of the holes Hol2, and H3 indicates a depth of each of the holes Hol2.

Referring to FIG. 15, a condition of Formula 3 may include a relationship described below. An angle θ5, which is an arctangent value of a diameter D2 of each of the holes Hol2 relative to a depth H3 of each of the holes Hol2, may be less than an angle θ6, which is an arctangent value of a separation distance D1 between the first and second wavelength conversion layers 123_1 and 123_2, relative to the height H1 of the first and second wavelength conversion layers 123_1 and 123_2. In some example embodiments, the transmitted light beam L4T that deviated from the first wavelength conversion layer 123_1 may not be leaked to the second wavelength conversion layer 123_2, thereby improving light extraction efficiency of the light-emitting device package.

The relationship in Formula 3 describes light emitted by the first luminescent structure 113_1, the intermediate layer 721, and the first and second wavelength conversion layers 123_1 and 123_2, as examples, but is not limited thereto. The relationship in Formula 3 may also be applied to relationships between light emitted by the second or third luminescent structure 113_2 or 113_3, the intermediate layer 721, and the second and third wavelength conversion layers 123_2 and 123_3.

The embodiments of the inventive concepts are not limited to certain shapes illustrated in the present specification, and may include modifications of shapes caused in fabrication processes.

FIGS. 16A through 16G are cross-sectional views illustrating a method of manufacturing the light-emitting device package 100 of FIGS. 2A through 6, in a processing order.

Figure 16A:
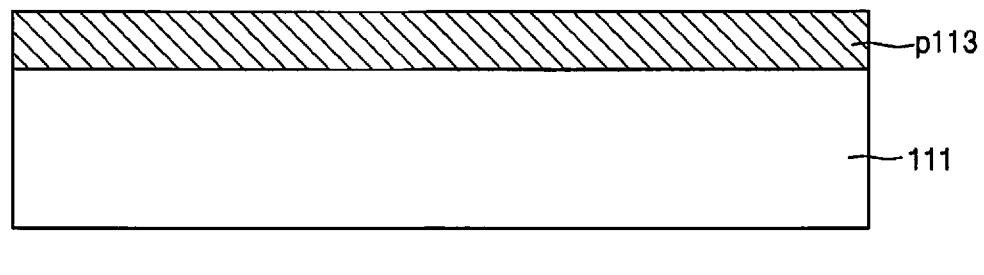
FIGS. 16A-G are cross-sectional views illustrating a method of manufacturing the light-emitting device package of FIGS. 2A through 6, in a processing order.
Figure 16A:
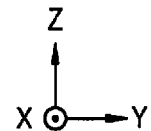

Referring to FIG. 16A, a preliminary luminescent structure p113 may be formed on a substrate 111. The substrate 111 may be an insulating, a conductive, or a semiconductor substrate. For example, the substrate 111 may be a sapphire, silicon carbide (SiC), silicon (Si), $MgAl_2O_4$, MgO, $LiAlO_2$, $LiGaO_2$, or GaN substrate.

Referring to FIG. 6 as well as FIG. 16A, the preliminary luminescent structure p113 may be formed by sequentially laminating the preliminary first conductive semiconductor layer 113s1, the preliminary active layer 113ac, and the preliminary second conductive semiconductor layer 113s2. The preliminary first conductive semiconductor layer 113s1, the preliminary active layer 113ac, and the preliminary second conductive semiconductor layer 113s2 may be formed by using a crystal growing process such as metal organic chemical vapor deposition (MOCVD), molecular beam epitaxy (MBE), or hydride vapor phase epitaxy (HVPE).

Although not shown in FIG. 16A, a buffer layer may further be formed on the substrate 111 before a process of forming the preliminary first conductive semiconductor layer 113s1 on the substrate 111. The buffer layer may include a material which has a lattice constant similar to that of the first conductive semiconductor layer 113s1. In some example embodiments, the buffer layer may prevent a generation of an electric potential defect or upward propagation of the defect when the buffer layer is provided as a growth surface of the preliminary luminescent structure p113 and the plurality of luminescent structures 113 are formed thereon.

Figure 16B:
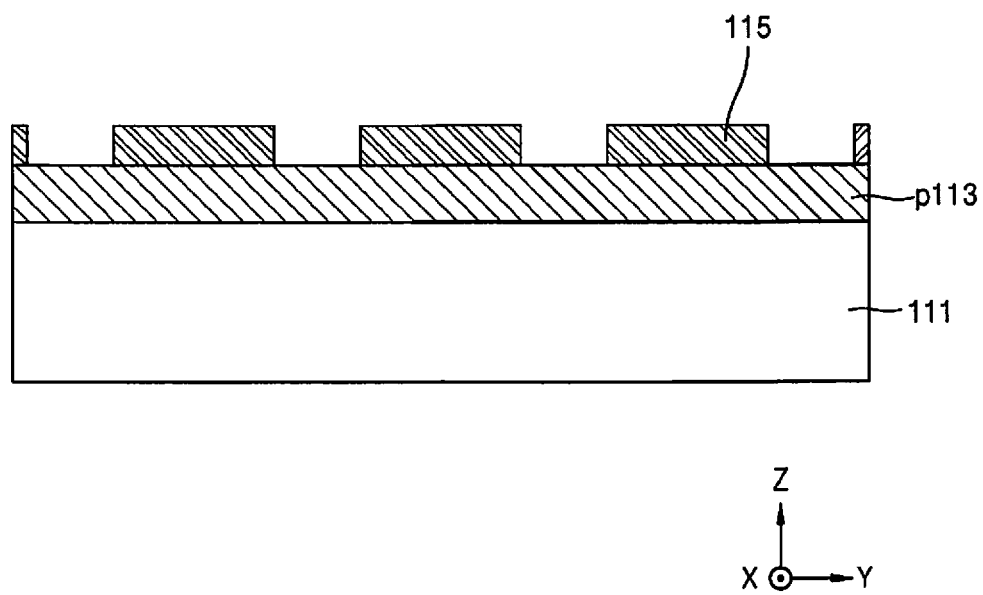

Referring to FIG. 16B, an electrode 115 electrically connected to the preliminary luminescent structure p113 may be formed. Referring to FIG. 6 as well as FIG. 16B, the first and second electrodes 115s1 and 115s2 may be respectively connected to the preliminary first and preliminary second conductive semiconductor layers 113s1 and 113s2, respectively. In detail, a through hole 190 penetrating through the active layer 113ac and the second conductive semiconductor layer 113s2 may be formed so that at least a part of the first conductive semiconductor layer 113s1 may be exposed. The through hole 190 may be formed by using an etching process such as reactive ion etching (RIE), or machining using a laser or a drill.

The insulating film 114 may be formed to cover an inner wall of the through hole 190 and an exposed surface of the second conductive semiconductor layer 113s2. The insulating film 114 may prevent an electrical connection between the first electrode 115s1, the active layer 113ac, and the second electrode 115s2. In a space limited by the insulating film 114 in the through hole 190, the first electrode 115s1 may be connected to the first conductive semiconductor layer 113s1. The second electrode 115s2 may penetrate through the insulating film 114 covering the second conductive semiconductor layer 113s2 and may be connected to the second conductive semiconductor layer 113s2.

The first and second electrodes 115s1 and 115s2 may be plural such that separate sets of electrodes, each separate set including a first and second electrode 115s1 and 115s2, are provided to separate light-emitting device chips, respectively.

Figure 16C:
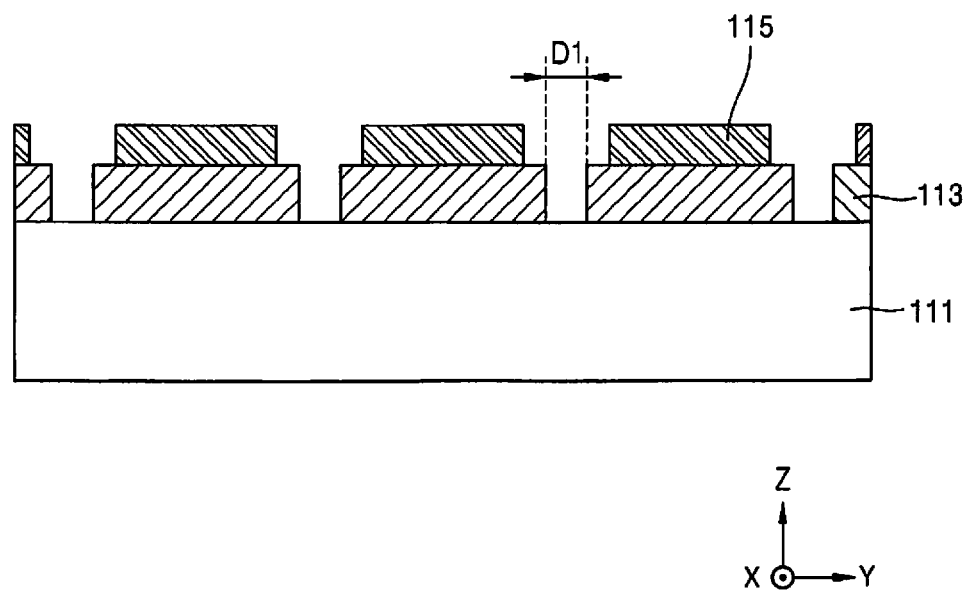

Referring to FIG. 16C, a plurality of luminescent structures 113 are formed by separating the preliminary luminescent structure p113 of FIG. 16B into individual light emitting units. A pair of first and second electrodes 115s1 and 115s2 may be included in the separation process. By the separation process, an upper surface of the substrate 111 may be exposed between the adjacent luminescent structures 113.

Although not shown in FIG. 16C, the luminescent structures 113 may have a trapezoid shape in which an upper portion is narrower than a lower portion, and in some example embodiments, the luminescent structures 113 may include side surfaces oblique to the upper surface of the substrate 111.

The separation process may be performed by etching to prevent a generation of a crack in the luminescent structures 113, but is not limited thereto.

Figure 16D:
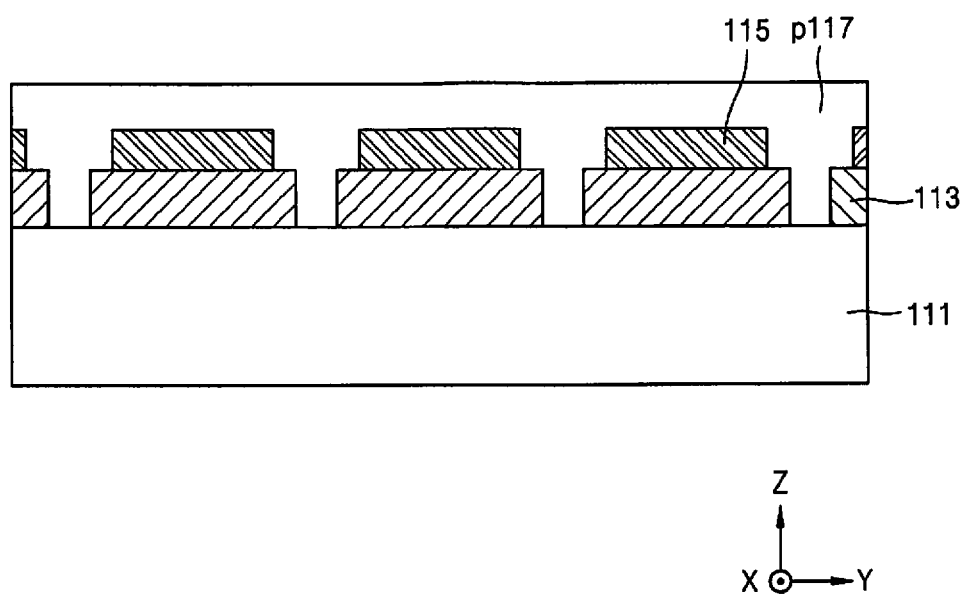

Referring to FIG. 16D, a preliminary first sealing member p117, which embeds a plurality of luminescent structures 113 and electrodes 115 connected to each of the luminescent structures 113, may be formed on an upper surface of a substrate 111. The preliminary first sealing member p117 may fill spaces between the electrodes 115 and spaces between the luminescent structures 113.

The preliminary first sealing member p117 may be formed by a process of coating a sealing member material to cover an upper surface of the electrodes 115.

Figure 16E:
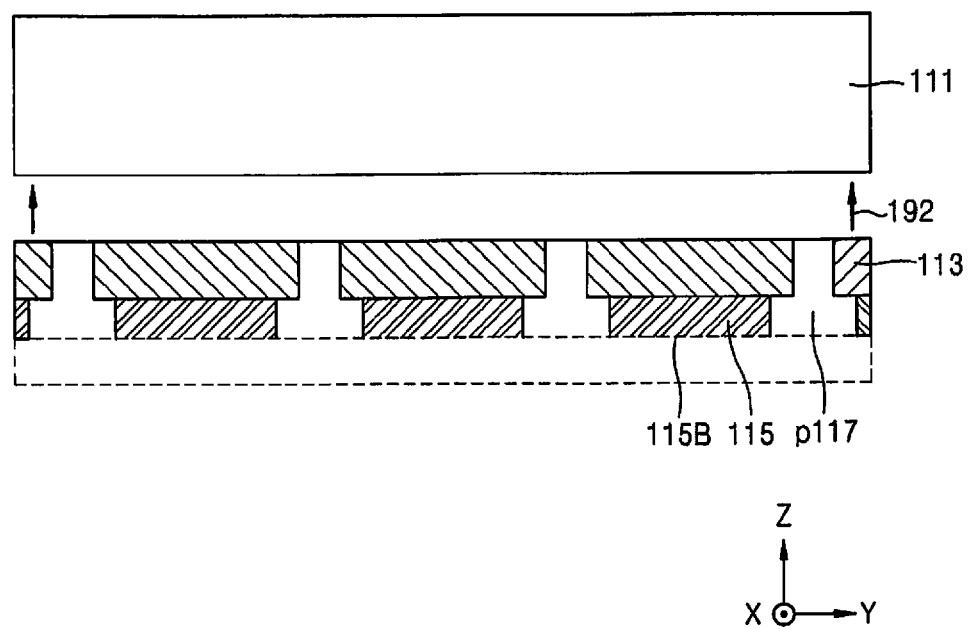

Referring to FIG. 16E, a preliminary first sealing member p117, which is a result of FIG. 16D, may be planarized by grinding so that a lower surface 115B of the electrode 115 may be exposed.

Afterwards, the substrate 111 may be removed 192 based on turning over (e.g., "inverting") the device formed in FIG. 16D. If and/or when the substrate 111 is a transparent substrate like a sapphire, the substrate 111 may be separated from the luminescent structures 113 by using a laser lift-off (LLO) process. If the substrate 111 is a non-transparent substrate like Si, the substrate 111 may be removed by grinding, polishing, dry etching, or a combination thereof.

After removing the substrate 111, uneven patterns may be formed on an upper surface of the luminescent structures 113 to increase light extraction efficiency.

Figure 16F:
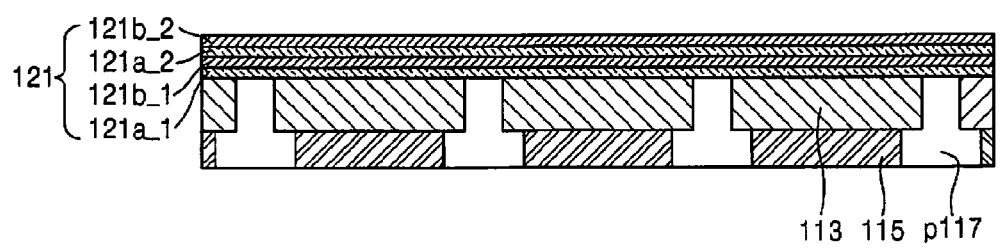

Referring to FIG. 16F, an intermediate layer 121 may be formed on the preliminary first sealing member p117 and the luminescent structures 113.

The intermediate layer 121 may be formed by sequentially depositing a first layer 121a_1, a second layer 121b_1, a first layer 121a_2, and a second layer 121b_2. The first layers 121a_1 and 121a_2 and the second layers 121b_1 and 121b_2 may include nitride, carbide, or oxide having refractive indexes different from each other, respectively. In detail, each of the first layers 121a_1 and 121a_2 and the second layers 121b_1 and 121b_2 may be two types of layers of ZrN, CrN, ZrC, ZnO, TiC, TaC, $Ga_2O_{23}$, $Cr_2O_3$, AlN, and GaN layers.

Thicknesses of the first layers 121a_1 and 121a_2 and the second layers 121b_1 and 121b_2 may be respectively adjusted by varying a deposition time.

Figure 16G:
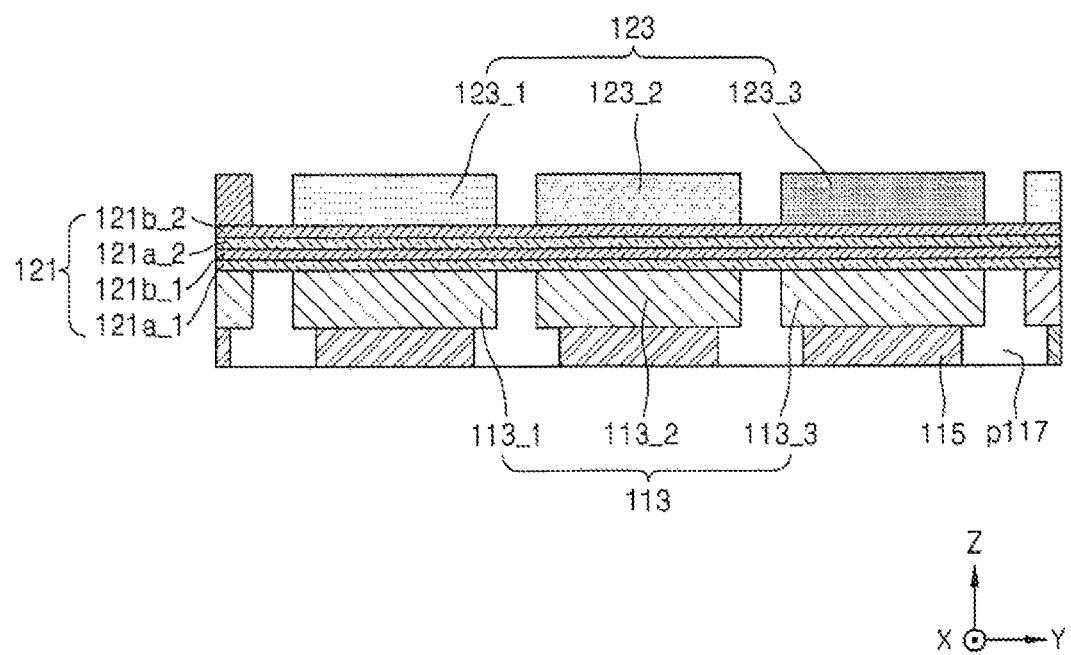

Referring to FIG. 16G, a wavelength conversion layer 123 may be formed on luminescent structures 113. The wavelength conversion layer 123, which includes first to third wavelength conversion layers 123_1, 123_2, and 123_3, may include different phosphors to emit different colors of light.

The first to third wavelength conversion layers 123_1, 123_2, and 123_3 may respectively overlap the luminescent structures 113 by a dispensing process, wherein the first to third wavelength conversion layers 123_1, 123_2, and 123_3 may be spaced apart from first to third luminescent structures 113_1, 113_2, and 113_3 included in the luminescent structures 113. The first to third wavelength conversion layers 123_1, 123_2, and 123_3 may be formed by an exposure process. For example, after entirely coating a wavelength conversion layer on the intermediate layer 121, the first to third wavelength conversion layers 123_1, 123_2, and 123_3, which respectively overlap the first to third luminescent structures 113_1, 113_2, and 113_3 and are spaced apart therefrom, may be formed by a photo lithography process. As illustrated in FIG. 16G, when the first to third wavelength conversion layers 123_1, 123_2, and 123_3 respectively including wavelength conversion materials different from each other are formed, the photo lithography process may be performed over a plurality of times.

Next, a singulation process and a molding process may be performed. The singulation process may be a process of separating into individual light-emitting devices package from wafer. The singulation process may use a sawing process using a sawing blade wheel or a cutting process using a pattern blade.

The molding process may be a process forming the second sealing member 125 covering the intermediate layer 121 and the first to third wavelength conversion layers 123_1, 123_2, and 123_3.

The light-emitting device package 100 of FIG. 2A may be manufactured based on performing a molding process after a singulation process. In some example embodiments, the second sealing member 125 may be formed to cover side surfaces of the first sealing member 117, side surfaces and an upper surface of the intermediate layer 121, and side surfaces and an upper surface of the wavelength conversion layer 123.

In some example embodiments, including the light-emitting device package 100 of FIG. 2B, the molding process may be performed before the singulation process. The second sealing member 125 may cover the upper surface of the intermediate layer 121, and the side surfaces and upper surface of the wavelength conversion layer 123, and may not cover the side surfaces of the first sealing member 117 and intermediate layer 121.

As such, the light-emitting device packages 100 and 100' of FIGS. 2A and 2B may be manufactured as described above in relation to FIGS. 16A through 16G.

Figure 17A:
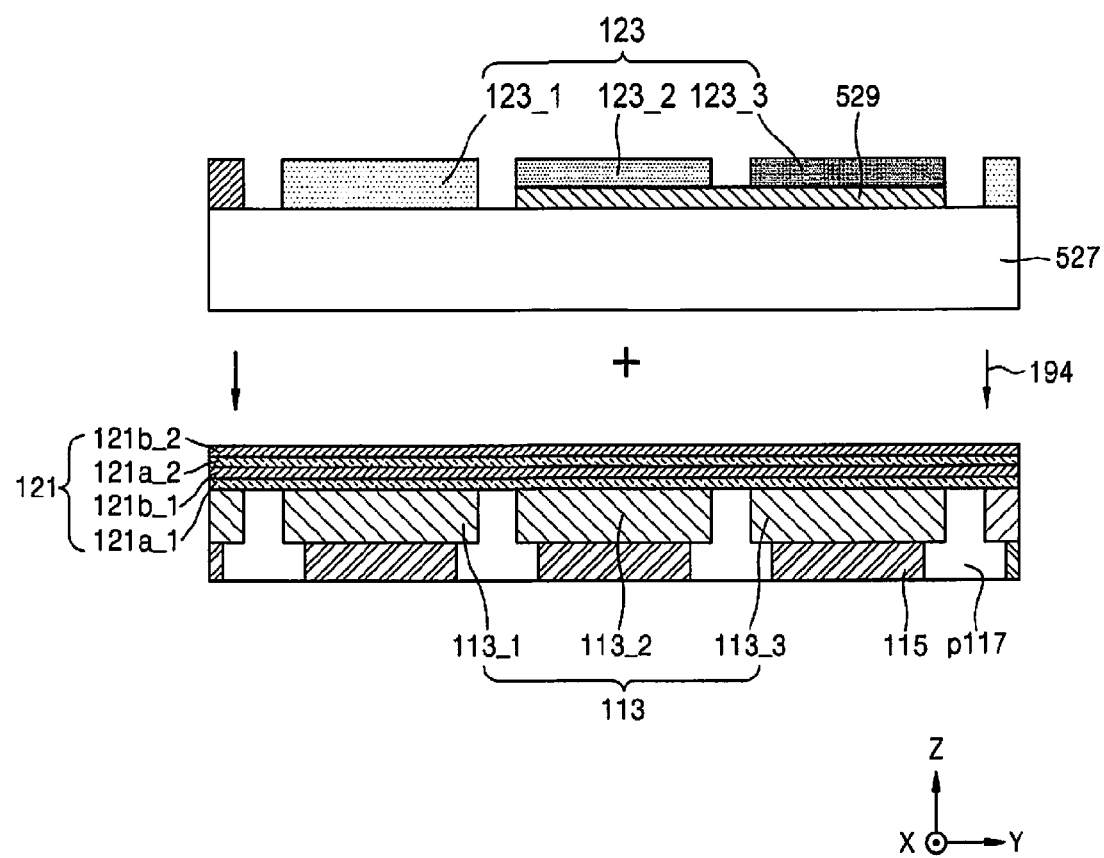
FIGS. 17A-B are cross-sectional views illustrating a method of manufacturing a light-emitting device package of FIG. 11, in a processing order.
Figure 17B:
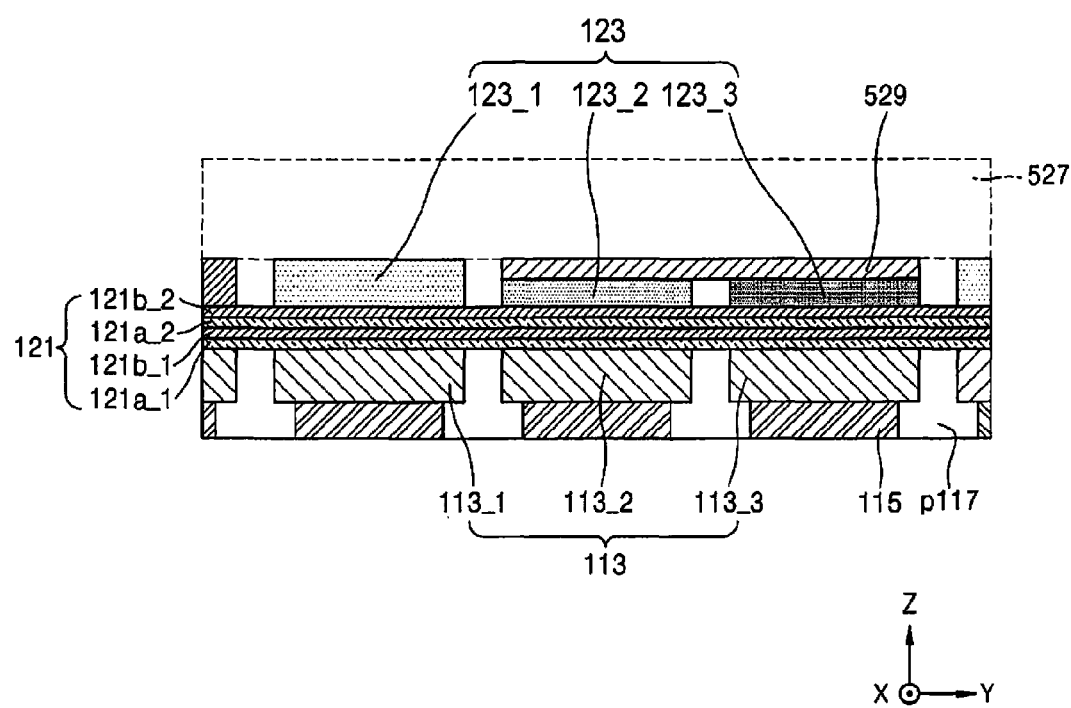

FIGS. 17A-B are cross-sectional views illustrating a method of manufacturing the light-emitting device package 500 of FIG. 11, in a processing order. The method of manufacturing the light-emitting device package 500 may include the manufacturing operation described with reference to FIGS. 16A through 16F as a preceding process, and descriptions thereof will not be repeated here.

Referring to FIG. 17A, a filter layer 529 and wavelength conversion layers 123 including first to third wavelength conversion layers 123_1, 123_2, and 123_3 may be formed on a substrate 527. In detail, the first wavelength conversion layer 123_1 and the filter layer 529 may be formed on the substrate 527, and the second and third wavelength conversion layers 123_2 and 123_3 may be formed on the filter layer 529, respectively. The substrate 527 may be a glass or a resin, but is not limited thereto.

The structure may be turned over and may be joined 194 onto the result of FIG. 16F. For example, an upper surface of the first to third wavelength conversion layers 123_1, 123_2, and 123_3 may be joined onto an intermediate layer 121 on a plurality of luminescent structures 113.

Referring to FIG. 17B, after the filter layer 529 and the first to third wavelength conversion layers 123_1, 123_2, and 123_3 are attached to the result of FIG. 16F, the substrate 527 may be removed.

Next, the light-emitting device package 500 of FIG. 11 may be manufactured by performing a singulation process and a molding process.

Figure 18A:
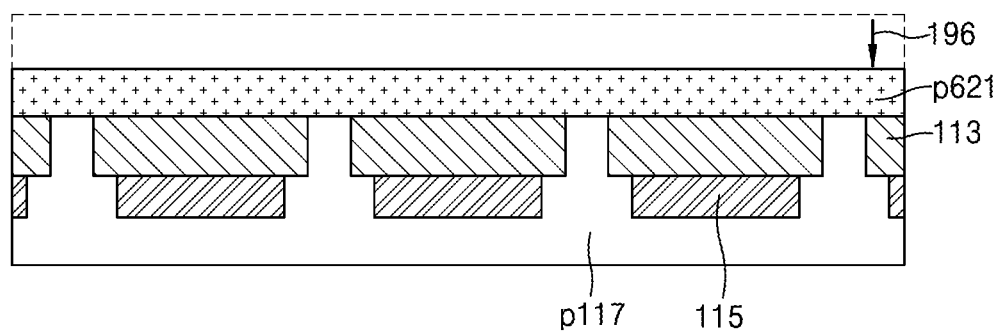
FIGS. 18A-C are cross-sectional views illustrating a method of manufacturing a light-emitting device package of FIG. 12A, in a processing order.
Figure 18B:
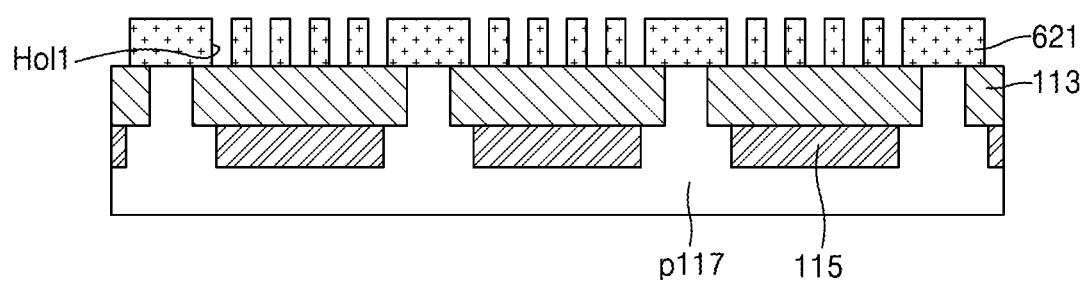
Figure 18C:
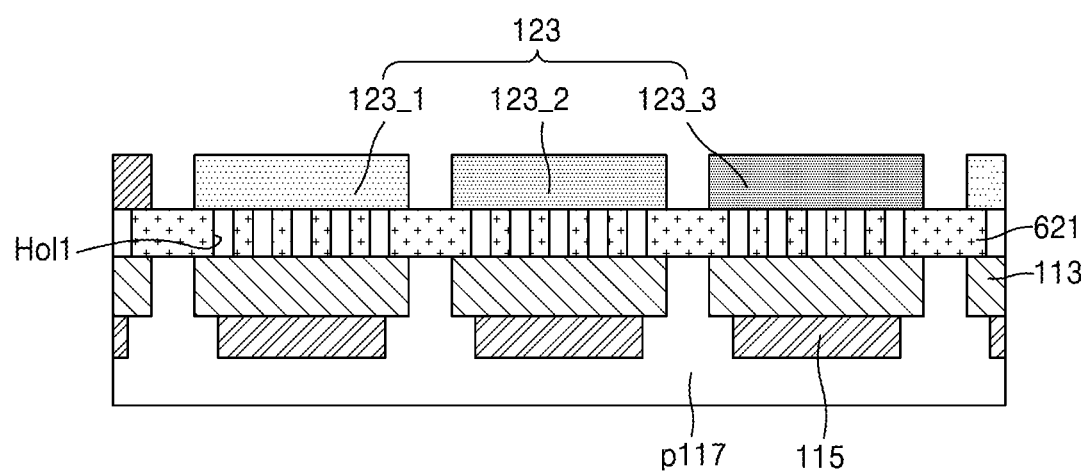

FIGS. 18A-C are cross-sectional views illustrating a method of manufacturing the light-emitting device package 600 of FIG. 12A, in a processing order. The method of manufacturing the light-emitting device package 600 may include the manufacturing operation described with reference to FIGS. 16A through 16D as a preceding process, and descriptions thereof will not be repeated here.

Referring to FIG. 18A, a thickness of the substrate 111 may be reduced 196 by a planarization process after turning over the result of FIG. 16D, and the substrate 111 having the reduced thickness may be a preliminary intermediate layer p621.

Referring to FIG. 18B, a plurality of holes Hol1 may be formed in a region where a plurality of luminescent structures 113 and the preliminary intermediate layer p621 overlap each other. In some example embodiments, the holes Hol1 may not be formed in sections of an intermediate layer 621 overlapping spaces between the adjacent luminescent structures 113.

The holes Hol1 may be formed by forming a mask pattern on the preliminary intermediate layer p621 and performing an etching process.

Referring to FIG. 18C, a plurality of wavelength conversion layers 123 may be formed in a region where the luminescent structures 113 and the intermediate layer 621 overlap each other.

Next, the light-emitting device package 600 of FIG. 12A may be manufactured by performing a singulation process and a molding process.

The method of manufacturing the light-emitting device package 600' of FIG. 12B is similar to that of FIGS. 18A to 18C, except that the reflective layer 627 is further included on inner walls of the holes Hol1 after forming the holes Hol1 of FIG. 12B. The reflective layer 627 may be manufactured by a plating process, an electron beam deposition process, or a sputtering process, but is not limited thereto.

The light-emitting device package 600' of FIG. 12B may be manufactured by performing the following process of FIG. 18C, after forming the reflective layer 627.

Figure 19A:
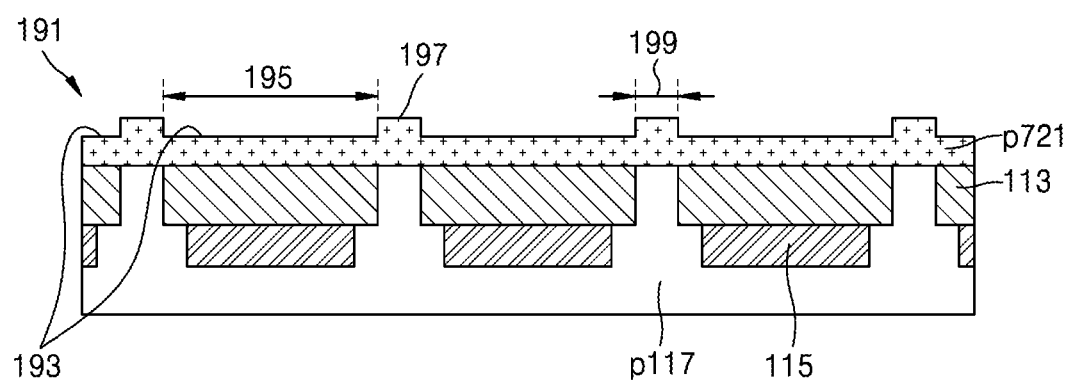
FIGS. 19A-C are cross-sectional views illustrating a method of manufacturing a light-emitting device package of FIG. 14, in a processing order.
Figure 19B:
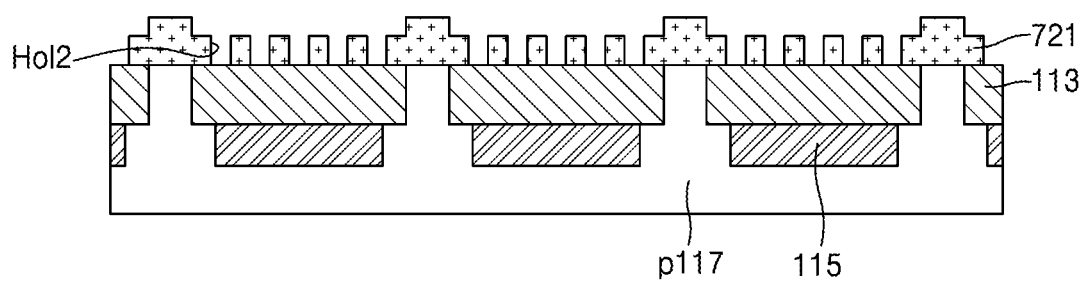

FIGS. 19A and 19B are cross-sectional views illustrating a method of manufacturing a light-emitting device package of FIG. 14, in a processing order. The method of manufacturing the light-emitting device package 700 may include the manufacturing operation described with reference to FIGS. 16A through 16D and FIG. 18A as a preceding process, and descriptions thereof will not be repeated here.

Referring to FIG. 19A, grooves 191 may be formed so that a level of an upper surface 193 of a part 195 of the preliminary intermediate layer p721 in the result of FIG. 18A may be lower than a level of an upper surface 197 in another part 199 of the preliminary intermediate layer p721. In detail, the grooves 191 may be formed in a part 195 of the preliminary intermediate layer p721 that vertically overlaps a region where the preliminary intermediate layer p721 and the luminescent structures 113 overlap each other, respectively. The grooves 191 may be formed by forming a mask pattern on the preliminary intermediate layer p721 and performing an etching process.

Referring to FIG. 19B, an intermediate layer 721 may be formed by forming a plurality of holes Hol2 in a preliminary intermediate layer p721 on which grooves 191 are formed. In some example embodiments, the holes Hol2 may not be formed in sections of the intermediate layer 721 overlapping spaces between the adjacent luminescent structures 113, as shown in FIG. 19B.

Figure 19C:
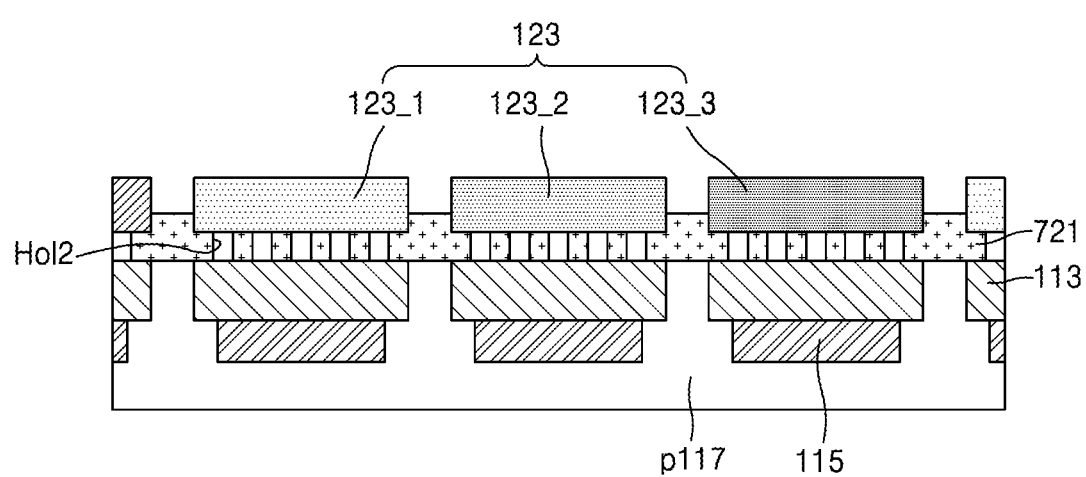

Referring to FIG. 19C, a plurality of wavelength conversion layers 123 may be formed in a region where the luminescent structures 113 and the intermediate layer 721 overlap each other, that is, where the grooves are formed thereon.

Next, the light-emitting device package 700 of FIG. 14 may be manufactured by performing a singulation process and a molding process.

When a certain embodiment may be implemented differently, a specific process order may be performed differently from the described order. For example, two consecutively described processes may be performed substantially at the same time or performed in an order opposite to the described order.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light-emitting device package comprising:
    a plurality of luminescent structures, the plurality of luminescent structures spaced apart from each other in a horizontal direction;
    one or more intermediate layers that are collectively on the plurality of luminescent structures, each intermediate layer of the one or more intermediate layers including a plurality of holes; and
    a plurality of wavelength conversion layers on the one or more intermediate layers, each wavelength conversion layer of the plurality of wavelength conversion layers vertically overlapping a separate, respective luminescent structure of the plurality of luminescent structures,
    wherein
        each intermediate layer of the one or more intermediate layers includes a first section and a second section,
        the first section of the intermediate layer vertically overlaps at least one luminescent structure of the plurality of luminescent structures,
        the second section of the intermediate layer does not vertically overlap any luminescent structure of the plurality of luminescent structures,
        the first section of the intermediate layer includes an upper surface,
        the second section of the intermediate layer includes an upper surface, and
        the upper surface of the second section is elevated above the upper surface of the first section of the intermediate layer.

2. The light-emitting device package of claim 1, wherein each intermediate layer of the one or more intermediate layers includes a plurality of layers, the plurality of layers associated with different refractive indexes, respectively.

3. The light-emitting device package of claim 2, wherein the plurality of layers in each intermediate layer of the one or more intermediate layers includes a plurality of alternately laminated layers.

4. The light-emitting device package of claim 1, further comprising:
a reflective layer on one or more inner walls of one or more holes of the plurality of holes.

5. The light-emitting device package of claim 1, wherein the plurality of wavelength conversion layers include at least one of:
different sets of one or more wavelength conversion materials, respectively, or
different concentrations of one or more wavelength conversion materials.

6. The light-emitting device package of claim 1, wherein each hole of the plurality of holes in each intermediate layer of the one or more intermediate layers is on one luminescent structure of the plurality of luminescent structures.

7. The light-emitting device package of claim 1, wherein
the plurality of luminescent structures include a first luminescent structure, a second luminescent structure, and a third luminescent structure;
the plurality of luminescent structures are configured to emit light in a common wavelength band; and
the plurality of wavelength conversion layers include
a first wavelength conversion layer vertically overlapping the first luminescent structure and including at least one phosphor configured to filter light emitted by the first luminescent structure to light in a wavelength band associated with red light,
a second wavelength conversion layer vertically overlapping the second luminescent structure and including at least one phosphor configured to filter light emitted by the second luminescent structure to light in a wavelength band associated with green light, and
a third wavelength conversion layer vertically overlapping the third luminescent structure and including at least one phosphor configured to filter light emitted by the second luminescent structure to light in a wavelength band associated with blue light.

8. The light-emitting device package of claim 1, further comprising:
a sealing member configured to cover the one or more intermediate layers and the plurality of wavelength conversion layers, the sealing member further configured to at least partially fill at least one space between at least two adjacent wavelength conversion layers of the plurality of wavelength conversion layers.

9. The light-emitting device package of claim 1, wherein
the plurality of wavelength conversion layers are on the first section of each intermediate layer; and
the second section of each intermediate layer at least partially covers one or more side surfaces of each wavelength conversion layer of the plurality of wavelength conversion layers.

10. A light-emitting device package comprising:
a plurality of luminescent structures, the plurality of luminescent structures spaced apart from each other in a horizontal direction;
one or more intermediate layers that are collectively on the plurality of luminescent structures, each intermediate layer of the one or more intermediate layers including a plurality of holes; and
a plurality of wavelength conversion layers on the one or more intermediate layers, each wavelength conversion layer of the plurality of wavelength conversion layers vertically overlapping a separate, respective luminescent structure of the plurality of luminescent structures, wherein
each adjacent wavelength conversion layer, of the plurality of wavelength conversion layers, is spaced apart according to a common first separation distance in the horizontal direction,
each wavelength conversion layer, of the plurality of wavelength conversion layers, has a common first thickness in a vertical direction,
each hole, of the plurality of holes, has a common first diameter in the horizontal direction and a common first depth in the vertical direction, and
an inverse tangent of a ratio of the first diameter to the first depth is less than an inverse tangent of a ratio of the first separation distance to the first thickness.

11. The light-emitting device package of claim 10, wherein each hole of the plurality of holes in each intermediate layer of the one or more intermediate layers is on one luminescent structure of the plurality of luminescent structures.

12. The light-emitting device package of claim 10, wherein
each intermediate layer of the one or more intermediate layers includes a first section and a second section;
the first section of the intermediate layer vertically overlaps at least one luminescent structure of the plurality of luminescent structures;
the second section of the intermediate layer does not vertically overlap any luminescent structure of the plurality of luminescent structures;
the first section of the intermediate layer includes an upper surface;
the second section of the intermediate layer includes an upper surface; and
the upper surface of the second section is elevated above the upper surface of the first section of the intermediate layer.

13. The light-emitting device package of claim 12, wherein
the plurality of wavelength conversion layers are on the first section of the intermediate layer; and
the second section of the intermediate layer at least partially covers one or more side surfaces of each wavelength conversion layer of the plurality of wavelength conversion layers.

14. The light-emitting device package of claim 10, further comprising:
a reflective layer on one or more inner walls of one or more holes of the plurality of holes.

15. A light-emitting device package, comprising:
a plurality of luminescent structures, the plurality of luminescent structures spaced apart from each other;
one or more intermediate layers that are collectively on the plurality of luminescent structures; and
a plurality of wavelength conversion layers on the one or more intermediate layers, each wavelength conversion layer of the plurality of wavelength conversion layers vertically overlapping a separate, respective luminescent structure of the plurality of luminescent structures, each wavelength conversion layer of the plurality of wavelength conversion layers configured to filter light emitted by a respective overlapped luminescent structure to emit light in a separate wavelength band,
wherein the one or more intermediate layers includes a plurality of sets of holes, each set of holes includes a separate plurality of holes, and each wavelength conversion layer of the plurality of wavelength conversion layers vertically overlaps a separate set of holes on the one or more intermediate layers, wherein the light-emitting device package further includes a reflective layer on one or more inner walls of one or more holes of each separate plurality of holes.

16. The light-emitting device package of claim 15, wherein each intermediate layer of the one or more intermediate layers includes a plurality of layers, the plurality of layers associated with different refractive indexes, respectively.

17. The light-emitting device package of claim 16, wherein the plurality of layers in the intermediate layer includes a plurality of alternately laminated layers.

18. The light-emitting device package of claim 15, wherein the plurality of wavelength conversion layers includes at least one of different sets of one or more wavelength conversion materials, respectively, or different concentrations of one or more wavelength conversion materials.

19. The light-emitting device package of claim 15, wherein each hole of each separate plurality of holes is on one luminescent structure of the plurality of luminescent structures.

20. The light-emitting device package of claim 15, wherein the plurality of luminescent structures include a first luminescent structure, a second luminescent structure, and a third luminescent structure;

the plurality of luminescent structures are configured to emit light in a common wavelength band; and the plurality of wavelength conversion layers include a first wavelength conversion layer vertically overlapping the first luminescent structure and including at least one phosphor configured to filter light emitted by the first luminescent structure to light in a wavelength band associated with red light, a second wavelength conversion layer vertically overlapping the second luminescent structure and including at least one phosphor configured to filter light emitted by the second luminescent structure to light in a wavelength band associated with green light, and a third wavelength conversion layer vertically overlapping the third luminescent structure and including at least one phosphor configured to filter light emitted by the second luminescent structure to light in a wavelength band associated with blue light.

* * * * *